(12) United States Patent
Yokomizo et al.

(10) Patent No.: US 11,463,047 B2
(45) Date of Patent: Oct. 4, 2022

(54) MIXER

(71) Applicant: MITSUBISHI ELECTRIC CORPORATION, Tokyo (JP)

(72) Inventors: Shinya Yokomizo, Tokyo (JP); Takanobu Fujiwara, Tokyo (JP); Masaomi Tsuru, Tokyo (JP); Mitsuhiro Shimozawa, Tokyo (JP); Akihito Hirai, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/466,669

(22) Filed: Sep. 3, 2021

(65) Prior Publication Data

US 2021/0399686 A1 Dec. 23, 2021

Related U.S. Application Data

(63) Continuation of application No. PCT/JP2020/009345, filed on Mar. 5, 2020.

(30) Foreign Application Priority Data

Mar. 12, 2019 (WO) .................. PCT/JP2019/010074

(51) Int. Cl.
*H03D 7/14* (2006.01)
*H04B 1/30* (2006.01)

(52) U.S. Cl.
CPC ......... *H03D 7/1458* (2013.01); *H03D 7/1441* (2013.01); *H04B 1/30* (2013.01)

(58) Field of Classification Search
CPC ...... H03D 7/14; H03D 7/1425; H03D 7/1433; H03D 7/1441; H03D 7/145; H03D 7/1458;
(Continued)

(56) References Cited

U.S. PATENT DOCUMENTS

| | | | |
|---|---|---|---|
| 8,957,722 B2* | 2/2015 | Zienkewicz | H03D 7/1458 455/313 |
| 9,431,961 B2* | 8/2016 | Lakdawala | H03D 7/1466 |
| 2010/0029239 A1 | 2/2010 | Asuri | |

FOREIGN PATENT DOCUMENTS

| | | |
|---|---|---|
| JP | 2005-184608 A | 7/2005 |
| JP | 2005-303054 A | 10/2005 |

OTHER PUBLICATIONS

Extended European Search Report dated Mar. 3, 2022 issued in counterpart European Application No. 20770366.1.

* cited by examiner

*Primary Examiner* — Diana J. Cheng
(74) *Attorney, Agent, or Firm* — Birch, Stewart, Kolasch & Birch, LLP

(57) ABSTRACT

A mixer includes a first unit mixer, a second unit mixer, a third unit mixer, and a fourth unit mixer that have the same configuration and a first combiner, a second combiner, and a third combiner that have the same configuration. The first to the fourth unit mixers each include a differential RF signal terminal. Output of the first unit mixer and output of the second unit mixer are combined by the second combiner. Output of the third unit mixer and output of the fourth unit mixer are combined by the third combiner. Output of the second combiner and output of the third combiner are combined by the first combiner. The output of the third unit mixer is input to the third combiner with the polarity being determined.

19 Claims, 15 Drawing Sheets

(58) Field of Classification Search
CPC .. H03D 7/1466; H03D 7/1475; H03D 7/1483; H03D 7/1491; H03D 3/00; H03D 3/007; H03D 3/008; H03D 3/009; H03D 2200/0066; H03D 2200/0074; H03D 2200/0078; H03D 2200/0082; H04B 1/06; H04B 1/16; H04B 1/30; H04B 1/302; H04B 2001/305; H04B 2001/307

See application file for complete search history.

MIXER

CROSS REFERENCE TO RELATED APPLICATIONS

This application is a Continuation of PCT International Application No. PCT/JP2020/009345 filed on 5 Mar. 2020, which claims priority under 35 U.S.C. § 119(a) to PCT International Application No. PCT/JP2019/010074 filed in Japan on 12 Mar. 2019. The above application is hereby expressly incorporated by reference, in its entirety, into the present application.

TECHNICAL FIELD

The present invention relates to a mixer including a plurality of unit mixers.

BACKGROUND ART

A mixer to be used in a transmission device is formed of a circuit configured to up-convert a baseband signal into a signal having a desired frequency band in a communication system of a direct conversion method or a heterodyne method. The mixer of such a type includes a first unit mixer, a second unit mixer, and a first combiner. The first unit mixer is configured to receive a local oscillation wave as input and up-convert a baseband signal in an I-channel. In the following description, the local oscillation wave is referred to as "LO wave". The second unit mixer is configured to receive an LO wave having a phase difference of 90° with respect to the LO wave of the first unit mixer as input and up-convert the baseband signal in a Q channel. The first combiner is configured to combine an output signal from the first unit mixer and an output signal from the second unit mixer.

In general, mixers are required to suppress unnecessary spurious responses that appear in output signals in order to achieve satisfactory communication.

Hitherto, unnecessary spurious responses are suppressed by, for example, a method described in Patent Literature 1 or Patent Literature 2.

In Patent Literature 1, a semiconductor integrated circuit for communication includes a frequency divider for generating an input signal to be supplied to a mixer configured to up-convert a transmission signal. The frequency divider is configured to generate the input signal by dividing a local oscillation signal. The frequency divider is formed through use of a Gilbert cell type circuit including a lower differential transistor and an upper differential transistor. A metal-oxide-semiconductor (MOS) transistor is used as the lower differential transistor, and a bipolar transistor is used as the upper differential transistor. At this time, a large number of unnecessary spurious responses occur at the output of the mixer. In order to suppress the unnecessary spurious responses, a low pass filter (LPF) is installed at the previous stage of input of the mixer.

A transmission system semiconductor integrated circuit apparatus described in Patent Literature 2 includes phase distribution means for phase-distributing a first local oscillation signal to 0° and 90°, amplitude equalization means for eliminating an amplitude error component of the phase-distributed local oscillation signal, a quadrature modulation mixer configured to output a quadrature modulated wave by multiplying the phase-distributed local oscillation signal and a baseband signal, and a frequency mixer configured to multiply the quadrature modulated wave and a second local oscillation signal. At this time, a large number of unnecessary spurious responses are generated at the output of the quadrature modulation mixer. In order to suppress the unnecessary spurious responses, a first LPF is installed at the previous stage of input of the quadrature modulation mixer, and a second LPF is installed at the subsequent stage of output of the quadrature modulation mixer.

CITATION LIST

Patent Literature

[PTL 1] JP 2005-184608 A
[PTL 2] JP 2005-303954 A

SUMMARY OF INVENTION

Technical Problem

In general, an amplifier configured to amplify a baseband signal is used at the previous stage of such a mixer for transmission as described in Patent Literature 1 or Patent Literature 2. However, when a common-mode gain rejection ratio (common mode rejection ratio (CMRR)) of the amplifier is low, or when isolation between a power supply and an output terminal cannot be sufficiently secured, a common-mode signal is included in each of a differential signal in an I-channel and a differential signal in a Q-channel. In that case, there is a problem in that the common-mode signals may occur at the output terminal as unnecessary spurious responses due to asymmetry of a load exhibited after the differential signals are up-converted by the quadrature mixer.

The present invention has been made in order to solve such a problem, and has an object to provide a mixer capable of suppressing unnecessary spurious responses ascribable to a common-mode signal in a mixer for transmission.

Solution to Problem

According to one embodiment of the present invention, there is provided a mixer including: a first unit mixer, a second unit mixer, a third unit mixer, and a fourth unit mixer each having the same configuration including: a baseband signal terminal; an LO input terminal; and an RF signal terminal configured to output a signal obtained by multiplying a signal input to the baseband signal terminal and a local oscillation wave input to the LO input terminal, at least one of the baseband signal terminal and the RF signal terminal being formed of a differential terminal; a first input terminal configured to receive input of a first input signal and in-phase-distribute the first input signal to supply common-mode signals to the baseband signal terminal of the first unit mixer and the baseband signal terminal of the second unit mixer; a second input terminal configured to receive input of a second input signal and in-phase-distribute the second input signal to supply common-mode signals to the baseband signal terminal of the third unit mixer and the baseband signal terminal of the fourth unit mixer; and a combiner configured to combine the signals output from the RF signal terminals of the first unit mixer, the second unit mixer, the third unit mixer, and the fourth unit mixer, wherein a first local oscillation wave and a second local oscillation wave which are in an orthogonal relationship are input to the LO input terminal of the first unit mixer and the LO input terminal of the second unit mixer, respectively, wherein a third local oscillation wave and a fourth local oscillation wave which are in an orthogonal relationship are input to the LO input terminal of the third unit mixer and the LO input terminal of the fourth unit mixer, respectively, wherein the first local oscillation wave differs in phase by 180° from one of the third local oscillation wave or the fourth local oscillation wave, wherein the second local oscillation wave differs in phase by 180° from one of the third local oscillation wave or the fourth local oscillation wave, and wherein one of the differential terminals has an inverted connection relationship with respect to the other differential terminals.

Advantageous Effects of Invention

The mixer according to the present invention exhibits an effect that unnecessary spurious responses ascribable to the common-mode signals that appear at the output terminals can be canceled and suppressed.

DESCRIPTION OF EMBODIMENTS

Now, mixers according to embodiments of the present invention are described with reference to the accompanying drawings.

First Embodiment

Figure 1:
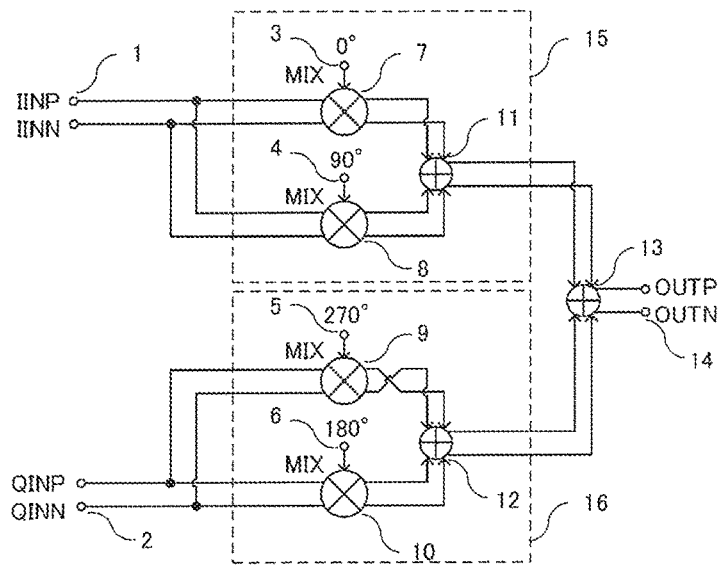
FIG. 1 is a diagram for illustrating one configuration example of a mixer for transmission according to a first embodiment of the present invention.

FIG. 1 is a diagram for illustrating one configuration example of a mixer according to a first embodiment of the present invention. In the first embodiment, a mixer to be used as a mixer for transmission is described as an example, but the embodiments are not limited thereto.

The mixer according to the first embodiment includes a first input terminal 1, a second input terminal 2, a first quadrature mixer 15, a second quadrature mixer 16, a first combiner 13 configured to combine an output signal from the first quadrature mixer 15 and an output signal from the second quadrature mixer 16, and a first output terminal 14.

The first quadrature mixer 15 includes a first unit mixer 7, a second unit mixer 8, and a second combiner 11. The first unit mixer 7 includes a baseband signal terminal and a radio frequency (RF) signal terminal, and also includes a first LO input terminal 3 configured to receive input of an LO wave of 0° serving as a first LO wave. The baseband signal terminal and the RF signal terminal of the first unit mixer 7 are each formed of a differential terminal. The second unit mixer 8 includes a baseband signal terminal and an RF signal terminal, and also includes a second LO input terminal 4 configured to receive input of an LO wave of 90° serving as a second LO wave. The baseband signal terminal and the RF signal terminal of the second unit mixer 8 are each formed of a differential terminal. The second combiner 11 is configured to combine an output signal from the first unit mixer 7 and an output signal from the second unit mixer 8. The first LO wave and the second LO wave are each input from a first LO wave oscillator (not shown). The first LO wave oscillator is formed of, for example, a quadrature oscillator.

In this case, the baseband signal terminal and the RF signal terminal are described as being both formed of differential terminals as an example, but are not limited to that case, and it suffices that at least one of the baseband signal terminal and the RF signal terminal is formed of a differential terminal. The differential terminal refers to a terminal provided with two terminals in parallel, one of the two terminals being configured to receive input of an original signal and the other terminal being configured to receive input of a signal having a polarity obtained by converting the polarity of the original signal. The first unit mixer 7 and the second unit mixer 8 have the same configuration. In this case, the LO waves to be supplied to the first unit mixer 7 and the second unit mixer 8 are described by taking the case of the phases being 0° and 90°, respectively, but are not limited to that case, and no particular limitations are imposed on the phases as long as the LO waves are orthogonal to each other.

The second quadrature mixer 16 includes a third unit mixer 9, a fourth unit mixer 10, and a third combiner 12. The third unit mixer 9 includes a baseband signal terminal and an RF signal terminal, and also includes a third LO input terminal 5 configured to receive input of an LO wave of 270° serving as a third LO wave. The baseband signal terminal and the RF signal terminal of the third unit mixer 9 are each formed of a differential terminal. As illustrated in FIG. 1, the RF signal terminal of the third unit mixer 9 is connected to the third combiner 12 with the polarity being inverted. The fourth unit mixer 10 includes a baseband signal terminal and an RF signal terminal, and also includes a fourth LO input terminal 6 configured to receive input of an LO wave of 180° serving as a fourth LO wave. The baseband signal terminal and the RF signal terminal of the fourth unit mixer 10 are each formed of a differential terminal. The third combiner 12 is configured to combine an output signal from the third unit mixer 9 and an output signal from the fourth unit mixer 10. The third LO wave and the fourth LO wave are each input from a second LO wave oscillator (not shown). The second LO wave oscillator is formed of, for example, a quadrature oscillator.

In this case, the baseband signal terminal and the RF signal terminal are described as being both formed of differential terminals as an example, but are not limited to that case, and it suffices that at least one of the baseband signal terminal and the RF signal terminal is formed of a differential terminal. The third unit mixer 9 and the fourth unit mixer 10 have the same configuration. In this case, the first to fourth unit mixers 7 to 10 are described as all having the same configuration. In this case, the LO waves to be supplied to the third unit mixer 9 and the fourth unit mixer 10 are described by taking the case of the phases being 270° and 180°, respectively, but are not limited to that case, and no particular limitations are imposed on the phases as long as the LO waves are orthogonal to each other. The LO wave to be oscillated from the first LO wave oscillator and the LO wave to be oscillated from the second LO wave oscillator differ in phase by 180°. In the above description, the LO wave to be input to the first unit mixer 7 and the LO wave to be input to the fourth unit mixer 10 are described as differing in phase by 180°, but the LO wave to be input to the first unit mixer 7 and the LO wave to be input to the third unit mixer 9 may be set to differ in phase by 180°. In the same manner, the LO wave to be input to the second unit mixer 8 and the LO wave to be input to the third unit mixer 9 are described as differing in phase by 180°, but the LO wave to be input to the second unit mixer 8 and the LO wave to be input to the fourth unit mixer 10 may be set to differ in phase by 180°.

A first input signal input to the first input terminal 1 is in-phase-distributed into a second signal and a third signal to be input to the first quadrature mixer 15. The second signal is input to the baseband signal terminal of the first unit mixer 7, and the third signal is input to the baseband signal terminal of the second unit mixer 8.

The first unit mixer 7 multiplies the second signal and the LO wave of 0° input from the first LO input terminal 3 to output a fourth signal from the RF signal terminal.

The second unit mixer 8 multiplies the third signal and the LO wave of 90° input from the second LO input terminal 4 to output a fifth signal from the RF signal terminal.

The second combiner 11 combines the fourth signal and the fifth signal to output a sixth signal.

Meanwhile, a second input signal input to the second input terminal 2 is in-phase-distributed into a seventh signal and an eighth signal to be input to the second quadrature mixer 16. The seventh signal is input to the baseband signal terminal of the third unit mixer 9, and the eighth signal is input to the baseband signal terminal of the fourth unit mixer 10.

The third unit mixer 9 multiplies the seventh signal and the LO wave of 270° input from the third LO input terminal 5 to output a ninth signal with the RF signal terminal being inverted.

The fourth unit mixer 10 multiplies the eighth signal and the LO wave of 180° input from the fourth LO input terminal 6 to output a tenth signal from the RF signal terminal.

The third combiner 12 combines the ninth signal and the tenth signal to output an eleventh signal.

The first combiner 13 combines the sixth signal and the eleventh signal to output the combined signal from the first output terminal 14 to the outside.

In this manner, in the first embodiment, the quadrature mixers 15 and 16 are formed of the four unit mixers 7 to 10 having the same configuration. The quadrature-phase LO waves having phase differences of 90°, namely, the LO waves of 0°, 90°, 180°, and 270° are used for those four unit mixers, namely, the first unit mixer 7, the second unit mixer 8, the third unit mixer 9, and the fourth unit mixer 10, respectively. The first combiner 13, the second combiner 11, and the third combiner 12 are provided, and hence the output signals from the first quadrature mixer 15 and the second quadrature mixer 16 are combined. In addition, the output of the third unit mixer 9 configured to input the LO wave of 270° is connected to the third combiner 12 at the subsequent stage with the polarity being inverted.

The configurations of the first quadrature mixer 15, the second quadrature mixer 16, the first combiner 13, the first unit mixer 7, the second unit mixer 8, the third unit mixer 9, the fourth unit mixer 10, the second combiner 11, and the third combiner 12 which are illustrated in FIG. 1 are merely examples, and are not limited thereto, and it is to be understood that components having other configurations may be used. In FIG. 1, the three combiners 11 to 13 are provided, but one combiner may be configured to combine the outputs of the four unit mixers 7 to 10.

Now, an operation of the mixer according to the first embodiment is described with reference to FIG. 2 to FIG. 7.

Figure 2:
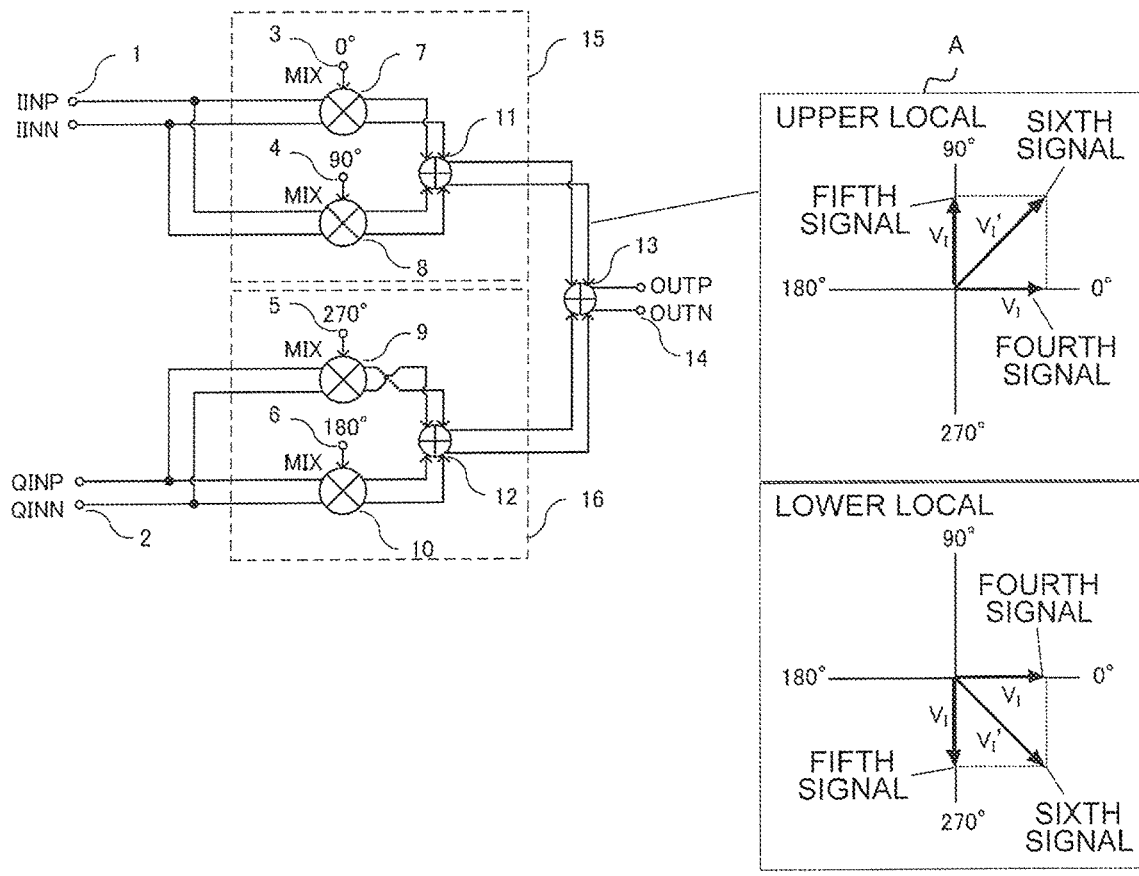
FIG. 2 is a diagram for illustrating a phase relationship between differential signals in an I-channel in the first embodiment.

FIG. 2 is a diagram for illustrating a phase relationship between differential signals in an I-channel in the first embodiment. When the amplitude of the fourth signal and the amplitude of the fifth signal are both set as $V_I$ and the amplitude of the sixth signal is set as $V_I'$, the phase and amplitude of the sixth signal are represented by a vector diagram indicated by reference symbol A of FIG. 2. In the vector diagram, an "upper local" case and a "lower local" case are each illustrated. The term "upper local" refers to a state in which the frequency of each of the first to fourth LO waves is set higher than the frequency of an RF signal. The term "lower local" refers to a state in which the frequency of each of the first to fourth LO waves is set lower than the frequency of the RF signal. The phases and amplitudes of the fourth signal, the fifth signal, and the sixth signal are as follows.

<Upper Local>

| Signal | Phase | Amplitude |
|---|---|---|
| Fourth signal | 0° | $V_I$ |
| Fifth signal | 90° | $V_I$ |
| Sixth signal | 45° | $V_I'$ |

<Lower Local>

| Signal | Phase | Amplitude |
|---|---|---|
| Fourth signal | 0° | $V_I$ |
| Fifth signal | 270° | $V_I$ |
| Sixth signal | 315° | $V_I'$ |

Figure 3:
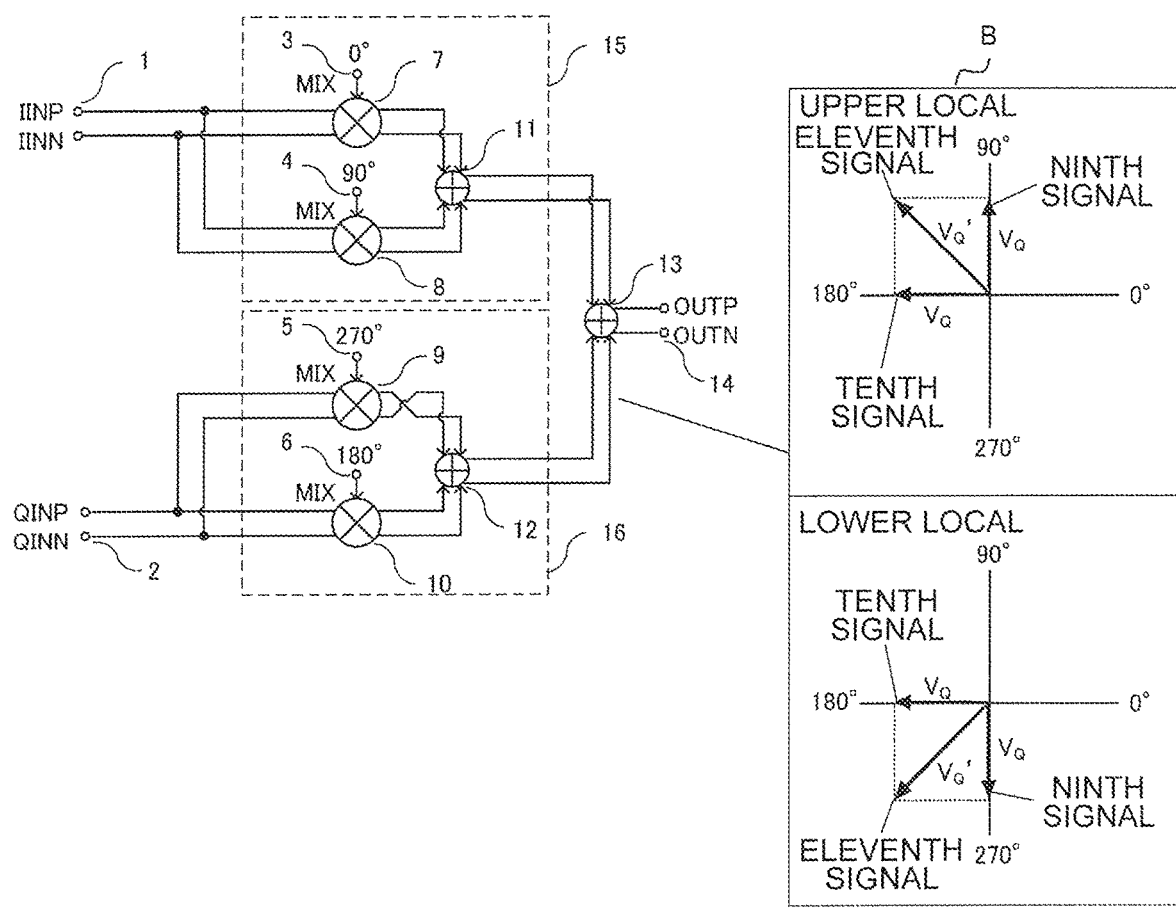
FIG. 3 is a diagram for illustrating a phase relationship between differential signals in a Q-channel in the first embodiment.

FIG. 3 is a diagram for illustrating a phase relationship between differential signals in a Q-channel in the first embodiment. When the amplitude of the ninth signal and the amplitude of the tenth signal are both set as $V_Q$ and the amplitude of the eleventh signal is set as $V_Q'$, the phase and amplitude of the eleventh signal are represented by a vector diagram indicated by reference symbol B of FIG. 3. In the vector diagram, an "upper local" case and a "lower local" case are each illustrated. The phases and amplitudes of the ninth signal, the tenth signal, and the eleventh signal are as follows.

<Upper Local>

| Signal | Phase | Amplitude |
|---|---|---|
| Ninth signal | 90° | $V_Q$ |
| Tenth signal | 180° | $V_Q$ |
| Eleventh signal | 135° | $V_Q'$ |

<Lower Local>

| Signal | Phase | Amplitude |
|---|---|---|
| Ninth signal | 270° | $V_Q$ |
| Tenth signal | 180° | $V_Q$ |
| Eleventh signal | 225° | $V_Q'$ |

Figure 4:
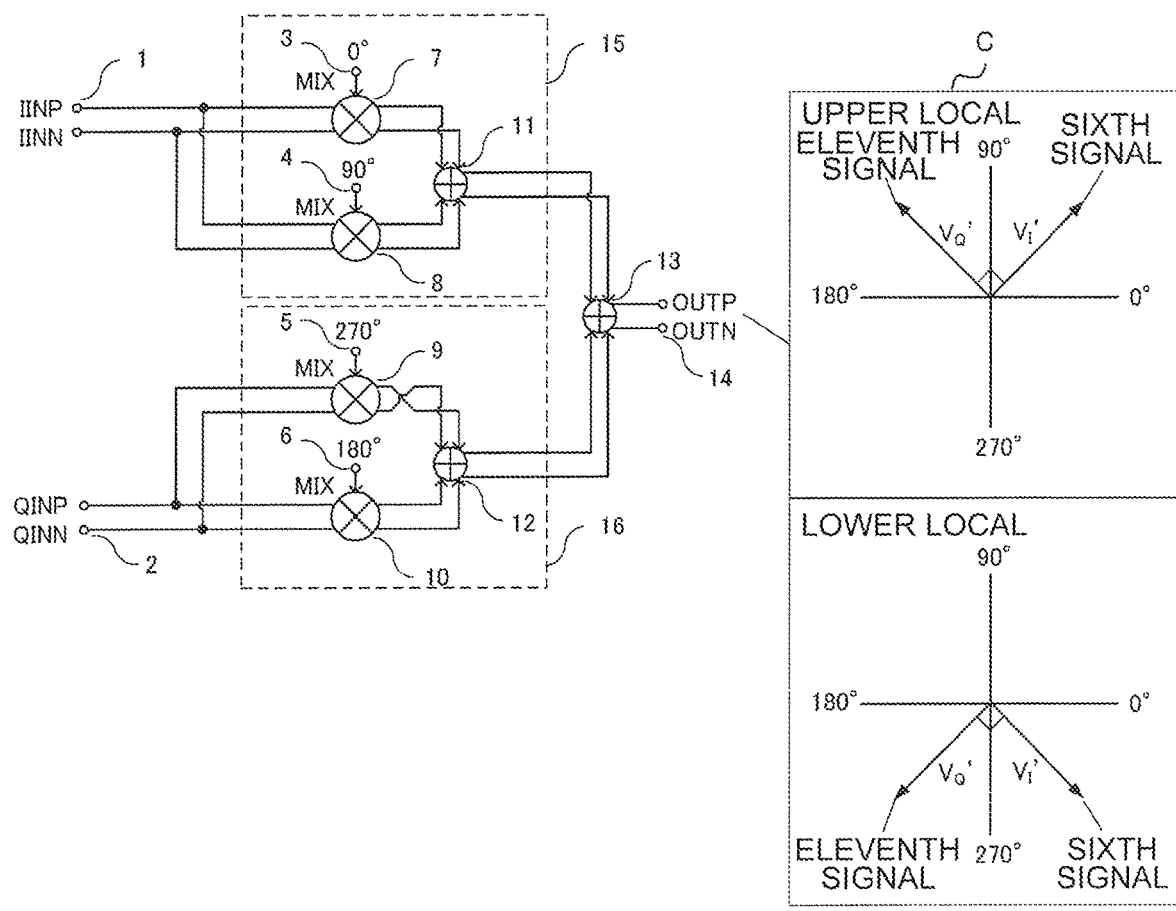
FIG. 4 is a diagram for illustrating a phase relationship between differential signals that have been combined in the first embodiment.

FIG. 4 is a diagram for illustrating a phase relationship between differential signals that have been combined in the first embodiment. The phases and amplitudes of the sixth signal and the eleventh signal at the first output terminal 14 are represented by a vector diagram indicated by reference symbol C of FIG. 4. In the vector diagram, an "upper local" case and a "lower local" case are each illustrated. The phases and amplitudes of the sixth signal and the eleventh signal are as follows.

<Upper Local>

| Signal | Phase | Amplitude |
|---|---|---|
| Sixth signal | 45° | $V_I'$ |
| Eleventh signal | 135° | $V_Q'$ |

<Lower Local>

| Signal | Phase | Amplitude |
|---|---|---|
| Sixth signal | 315° | $V_I'$ |
| Eleventh signal | 225° | $V_Q'$ |

In this manner, the signal in the I-channel and the signal in the Q-channel are orthogonal to each other, and hence the mixer according to the first embodiment illustrated in FIG. 1 operates as a quadrature mixer.

Figure 5:
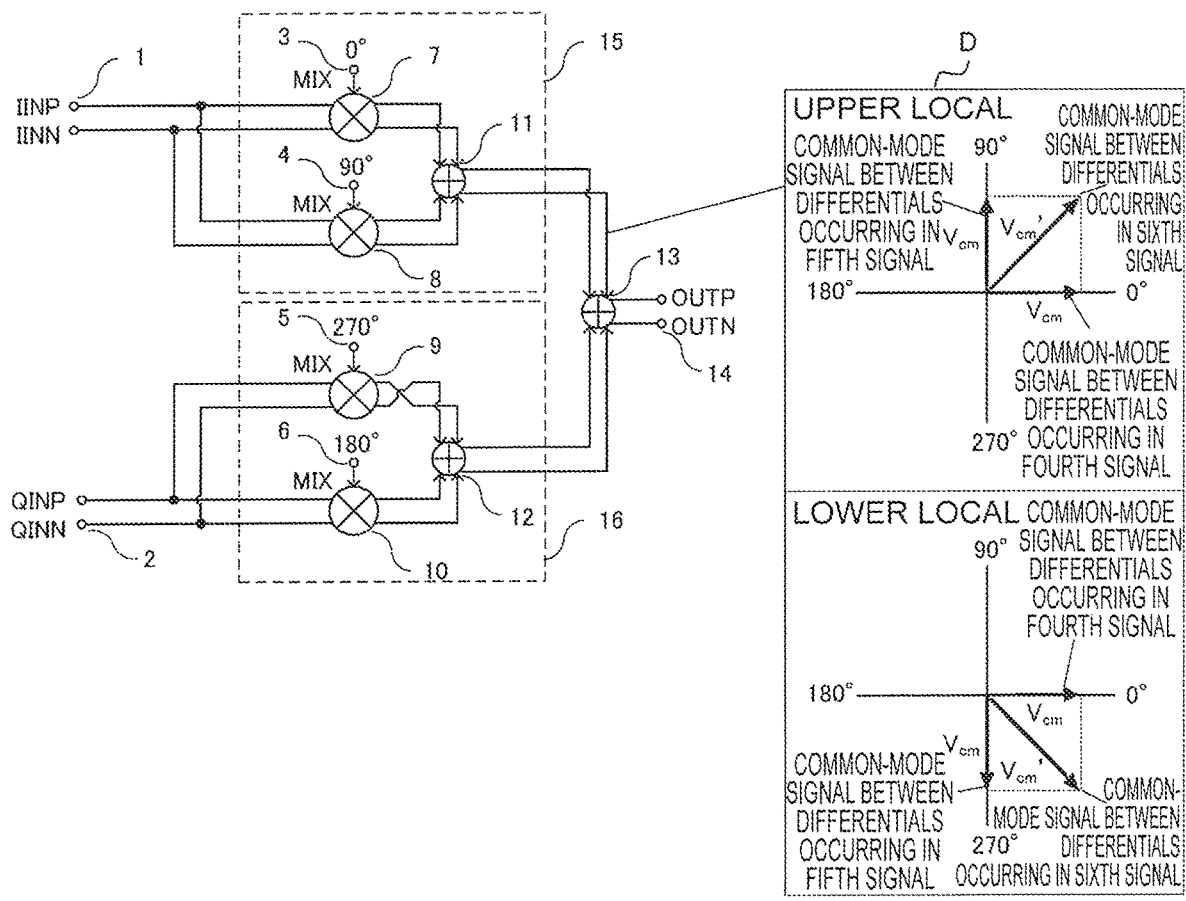
FIG. 5 is a diagram for illustrating a phase relationship between common-mode signals in the I-channel in the first embodiment.

FIG. 5 is a diagram for illustrating a phase relationship between common-mode signals in the I-channel in the first embodiment. When the amplitudes of common-mode signals between differentials occurring in the fourth signal and the fifth signal are both set as $V_{cm}$ and the amplitude of a common-mode signal between differentials occurring in the sixth signal is set as $V_{cm}'$, the phase and amplitude of the common-mode signal between the differentials occurring in the sixth signal is represented by a vector diagram indicated by reference symbol D of FIG. 5. In the vector diagram, an "upper local" case and a "lower local" case are each illustrated. The phases and amplitudes of the common-mode signal between the differentials occurring in the fourth signal, the common-mode signal between the differentials occurring in the fifth signal, and the common-mode signal between the differentials occurring in the sixth signal are as follows.

<Upper Local>

| Signal | Phase | Amplitude |
|---|---|---|
| Common-mode signal between differentials occurring in fourth signal | 0° | $V_{cm}$ |
| Common-mode signal between differentials occurring in fifth signal | 90° | $V_{cm}$ |
| Common-mode signal between differentials occurring in sixth signal | 45° | $V_{cm}'$ |

<Lower Local>

| Signal | Phase | Amplitude |
|---|---|---|
| Common-mode signal between differentials occurring in fourth signal | 0° | $V_{cm}$ |
| Common-mode signal between differentials occurring in fifth signal | 270° | $V_{cm}$ |
| Common-mode signal between differentials occurring in sixth signal | 315° | $V_{cm}'$ |

Figure 6:
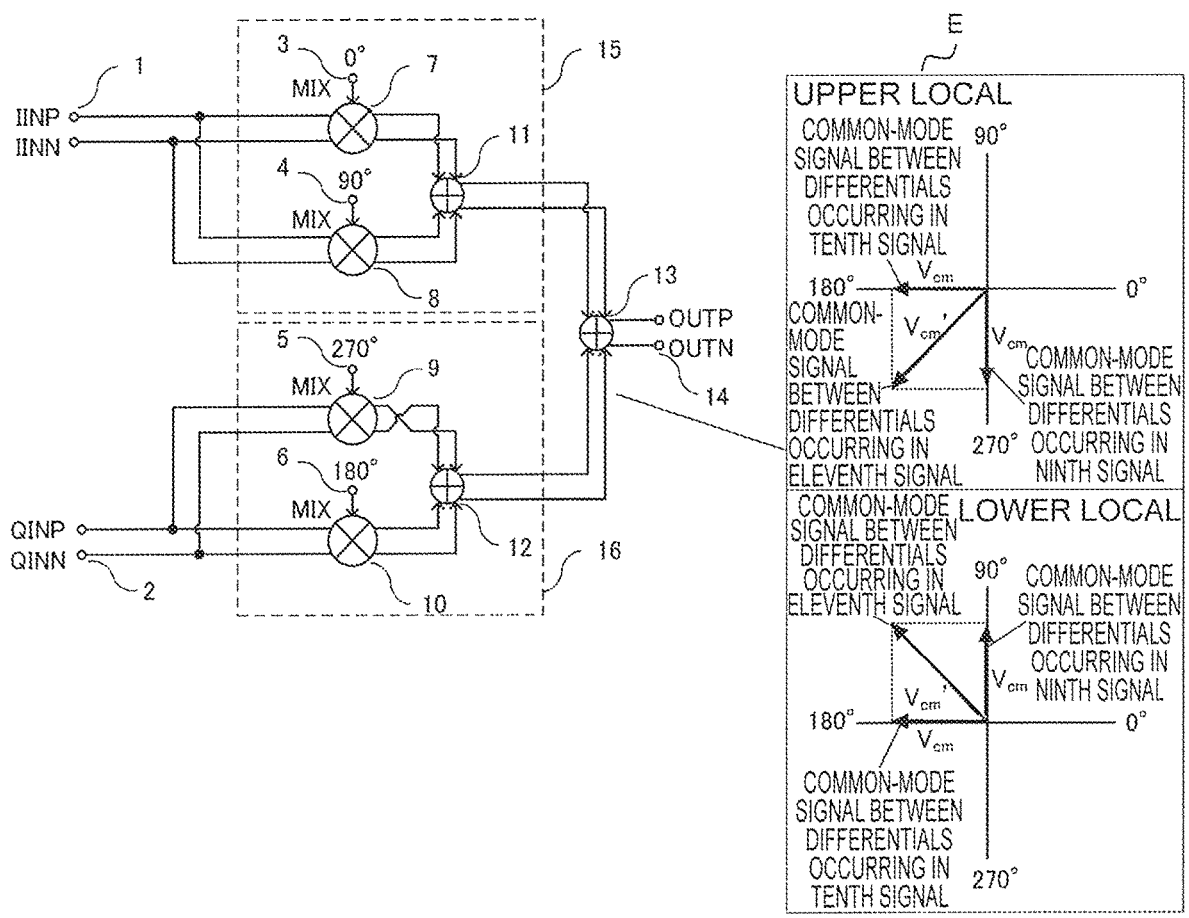
FIG. 6 is a diagram for illustrating a phase relationship between common-mode signals in a Q-channel in the first embodiment.

FIG. 6 is a diagram for illustrating a phase relationship between common-mode signals in the Q-channel in the first embodiment. When the amplitudes of common-mode signals between differentials occurring in the ninth signal and the tenth signal are both set as $V_{cm}$ and the amplitude of a common-mode signal between differentials occurring in the eleventh signal is set as $V_{cm}'$, the phase and amplitude of the common-mode signal between the differentials occurring in the eleventh signal is represented by a vector diagram indicated by reference symbol E of FIG. 6. In the vector diagram, an "upper local" case and a "lower local" case are each illustrated. The phases and amplitudes of the common-mode signal between the differentials occurring in the ninth signal, the common-mode signal between the differentials occurring in the tenth signal, and the common-mode signal between the differentials occurring in the eleventh signal are as follows.

<Upper Local>

| Signal | Phase | Amplitude |
| --- | --- | --- |
| Common-mode signal between differentials occurring in ninth signal | 270° | $V_{cm}$ |
| Common-mode signal between differentials occurring in tenth signal | 180° | $V_{cm}$ |
| Common-mode signal between differentials occurring in eleventh signal | 225° | $V_{cm}'$ |

<Lower Local>

| Signal | Phase | Amplitude |
| --- | --- | --- |
| Common-mode signal between differentials occurring in ninth signal | 90° | $V_{cm}$ |
| Common-mode signal between differentials occurring in tenth signal | 180° | $V_{cm}$ |
| Common-mode signal between differentials occurring in eleventh signal | 135° | $V_{cm}'$ |

Figure 7:
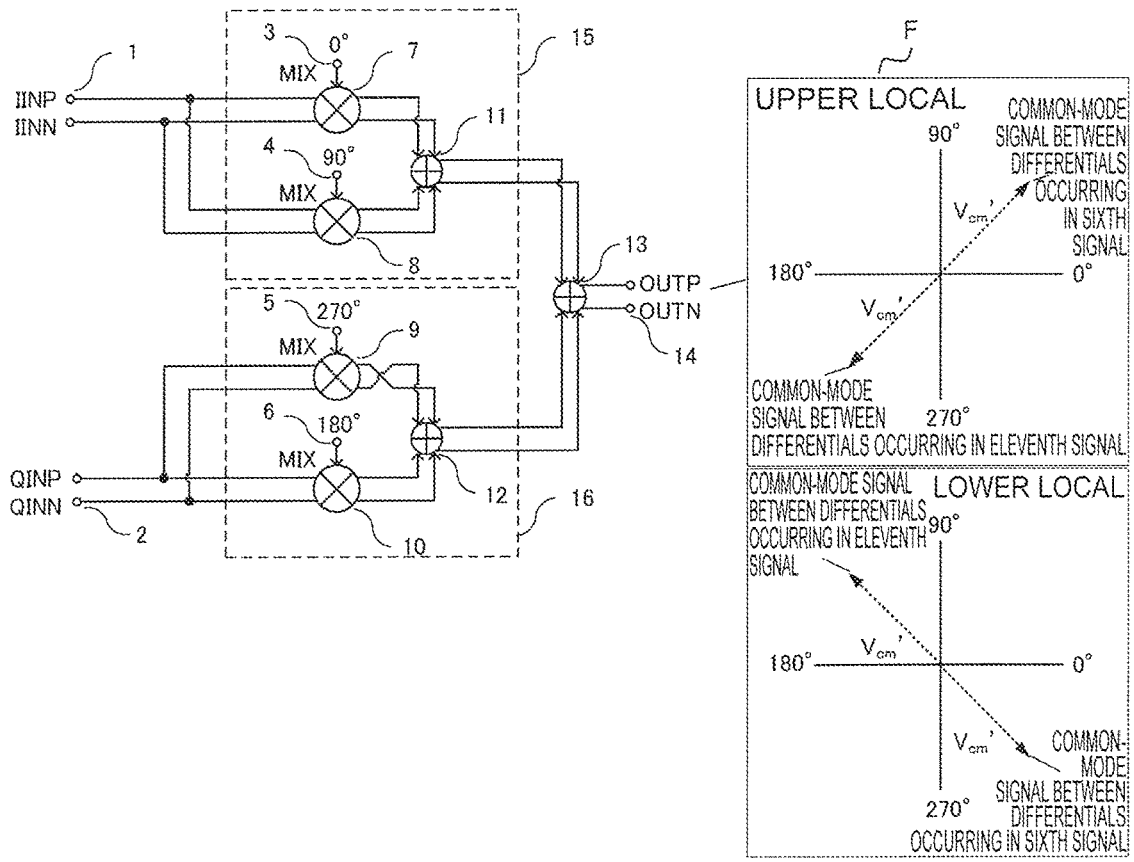
FIG. 7 is a diagram for illustrating a phase relationship between common-mode signals that have been combined in the first embodiment.

FIG. 7 is a diagram for illustrating a phase relationship between common-mode signals that have been combined in the first embodiment. The phases and amplitudes of the sixth signal and the eleventh signal at the first output terminal 14 are represented by a vector diagram indicated by reference symbol F of FIG. 7. In the vector diagram, an "upper local" case and a "lower local" case are each illustrated. The phases and amplitudes of the sixth signal and the eleventh signal are as follows.

<Upper Local>

| Signal | Phase | Amplitude |
| --- | --- | --- |
| Sixth signal | 45° | $V_{cm}'$ |
| Eleventh signal | 225° | $V_{cm}'$ |

<Lower Local>

| Signal | Phase | Amplitude |
| --- | --- | --- |
| Sixth signal | 315° | $V_{cm}'$ |
| Eleventh signal | 135° | $V_{cm}'$ |

In this manner, in the mixer according to the first embodiment, the common-mode signal in the I channel and the common-mode signal in the Q channel are combined so as to have the same amplitude and opposite phases, and hence the common-mode signals are canceled.

As described above, in the first embodiment, the quadrature mixers 15 and 16 are formed of the four unit mixers 7 to 10 having the same configuration. Further, the first LO wave oscillator and the second LO wave oscillator that differ in phase by 180° are used to input the quadrature-phase LO waves having phase differences of 90° to those four unit mixers, namely, the first unit mixer 7, the second unit mixer 8, the third unit mixer 9, and the fourth unit mixer 10, respectively. Further, the first combiner 13, the second combiner 11, and the third combiner 12 are provided, and hence the output signals from the first quadrature mixer 15 and the second quadrature mixer 16 are combined to cancel the common-mode signal components as illustrated in FIG. 7. That is, the output of the first quadrature mixer 15 operating with the LO waves of 0° and 90° and the output of the second quadrature mixer 16 operating with the LO waves of 180° and 270° being the LO waves of the phases opposite to those of the first quadrature mixer 15 are combined to cancel the output signals. However, when the LO waves of the opposite phases are simply used, the differential signals and the common-mode signals are both canceled, and hence, in the first embodiment, only one differential terminal is inverted to be connected to the third combiner 12. With this configuration, the polarity of the differential signal is inverted before and after the portion at which the differential terminal is inverted, and the polarity of the common-mode signal remains the same. Therefore, in terms of the differential signal, a signal equivalent to that of a normal mixer can be obtained, and only a common-mode signal can be canceled. As a result, this configuration can suppress unnecessary spurious responses that occur when a common-mode component, for example, power supply noise, is mixed into the differential input.

For the above-mentioned reasons, it is possible to form a mixer capable of canceling a common-mode signal between differentials through use of the above-mentioned configuration described in the first embodiment. Further, although the phase relationship between the I channel and the Q channel is changed, even when an RF signal terminal formed of a differential terminal of one unit mixer of the first, second, third, or fourth unit mixers 7 to 10 is inverted and connected, the same operation can be achieved. Further, as long as the first, second, third, and fourth unit mixers 7 to 10 have the same configuration, the baseband signal terminal may be single-phase. Further, in the first embodiment, when a 90° phase difference splitting unit is provided at the previous stage of the first input terminal 1 and the second input terminal 2, the mixer according to the first embodiment can also be configured to operate as an image rejection mixer. That is, a third input signal is input to the 90° phase difference splitting unit. Thus, the 90° phase difference splitting unit generates the first input signal to be input to the first input terminal 1 and the second signal to be input to the second input terminal 2 from the third input signal. The 90° phase difference splitting unit may be formed of, for example, a 90° phase difference splitter and a 90° phase shifter, or may be formed of an in-phase splitter and a 90° phase shifter.

Second Embodiment

Figure 8:
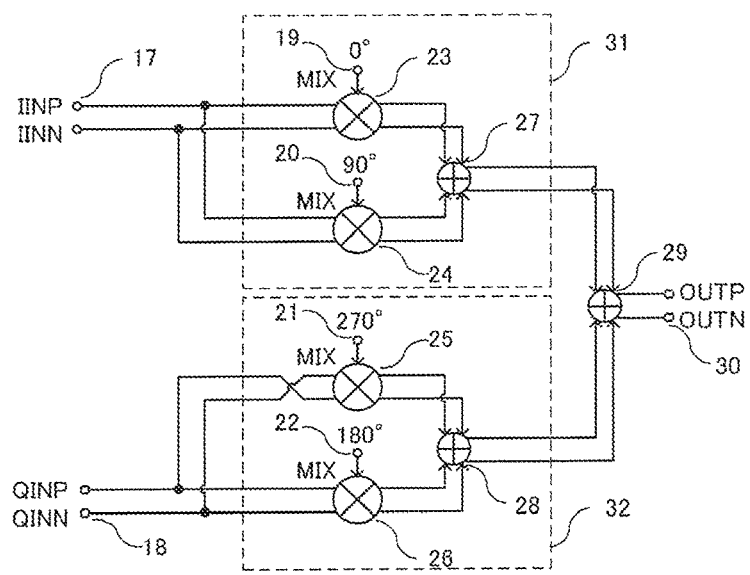
FIG. 8 is a diagram for illustrating one configuration example of a mixer for transmission according to a second embodiment of the present invention.

FIG. 8 is a diagram for illustrating one configuration example of a mixer according to a second embodiment of the present invention. In the second embodiment, a mixer to be used as a mixer for transmission is described as an example, but the embodiments are not limited thereto.

The mixer according to the second embodiment includes a first input terminal 17, a second input terminal 18, a first quadrature mixer 31, a second quadrature mixer 32, a first combiner 29 configured to combine an output signal from the first quadrature mixer 31 and an output signal from the second quadrature mixer 32, and a first output terminal 30.

The first quadrature mixer 31 includes a first unit mixer 23, a second unit mixer 24, and a second combiner 27. The first unit mixer 23 includes a baseband signal terminal and an RF signal terminal, and also includes a first LO input terminal 19 configured to receive input of an LO wave of 0° serving as a first LO wave. The baseband signal terminal and the RF signal terminal of the first unit mixer 23 are each formed of a differential terminal. The second unit mixer 24 includes a baseband signal terminal and an RF signal terminal, and also includes a second LO input terminal 20 configured to receive input of an LO wave of 90° serving as a second LO wave. The baseband signal terminal and the RF signal terminal of the second unit mixer 24 are each formed of a differential terminal. The second combiner 27 is configured to combine an output signal from the first unit mixer 23 and an output signal from the second unit mixer 24. The first LO wave and the second LO wave are each input from a first LO wave oscillator (not shown). The first LO wave oscillator is formed of, for example, a quadrature oscillator.

In this case, the baseband signal terminal and the RF signal terminal are described as being both formed of differential terminals as an example, but are not limited to that case, and it suffices that at least one of the baseband signal terminal and the RF signal terminal is formed of a differential terminal. The first unit mixer 23 and the second unit mixer 24 have the same configuration. In this case, the LO waves to be supplied to the first unit mixer 23 and the second unit mixer 24 are described by taking the case of the phases being 0° and 90°, respectively, but are not limited to that case, and no particular limitations are imposed on the phases as long as the LO waves are orthogonal to each other.

The second quadrature mixer 32 includes a third unit mixer 25, a fourth unit mixer 26, and a third combiner 28. The third unit mixer 25 includes a baseband signal terminal and an RF signal terminal, and also includes a third LO input terminal 21 configured to receive input of an LO wave of 270° serving as a third LO wave. The baseband signal terminal and the RF signal terminal of the third unit mixer 25 are each formed of a differential terminal. The baseband signal terminal of the third unit mixer 25 is connected to the second input terminal 18 with the polarity being inverted. The fourth unit mixer 26 includes a baseband signal terminal and an RF signal terminal, and also includes a fourth LO input terminal 22 configured to receive input of an LO wave of 180° serving as a fourth LO wave. The baseband signal terminal and the RF signal terminal of the fourth unit mixer 26 are each formed of a differential terminal. The third combiner 28 is configured to combine an output signal from the third unit mixer 25 and an output signal from the fourth unit mixer 26. The third LO wave and the fourth LO wave are each input from a second LO wave oscillator (not shown). The second LO wave oscillator is formed of, for example, a quadrature oscillator.

In this case, the baseband signal terminal and the RF signal terminal are described as being both formed of differential terminals as an example, but are not limited to that case, and it suffices that at least one of the baseband signal terminal and the RF signal terminal is formed of a differential terminal. The third unit mixer 25 and the fourth unit mixer 26 have the same configuration. In this case, the first to fourth unit mixers 23 to 26 are described as all having the same configuration. In this case, the LO waves to be supplied to the third unit mixer 25 and the fourth unit mixer 26 are described by taking the case of the phases being 270° and 180°, respectively, but are not limited to that case, and no particular limitations are imposed on the phases as long as the LO waves are orthogonal to each other. The LO wave to be oscillated from the first LO wave oscillator and the LO wave to be oscillated from the second LO wave oscillator differ in phase by 180°. In the above description, the LO wave to be input to the first unit mixer 23 and the LO wave to be input to the fourth unit mixer 26 are described as differing in phase by 180°, but the LO wave to be input to the first unit mixer 23 and the LO wave to be input to the third unit mixer 25 may be set to differ in phase by 180°. In the same manner, the LO wave to be input to the second unit mixer 24 and the LO wave to be input to the third unit mixer 25 are described as differing in phase by 180°, but the LO wave to be input to the second unit mixer 24 and the LO wave to be input to the fourth unit mixer 26 may be set to differ in phase by 180°.

A first input signal input to the first input terminal 17 is in-phase-distributed into a second signal and a third signal to be input to the first quadrature mixer 31. The second signal is input to the baseband signal terminal of the first unit mixer 23, and the third signal is input to the baseband signal terminal of the second unit mixer 24.

The first unit mixer 23 multiplies the second signal and the LO wave of 0° input from the first LO input terminal 19 to output a fourth signal from the RF signal terminal.

The second unit mixer 24 multiplies the third signal and the LO wave of 90° input from the second LO input terminal 20 to output a fifth signal from the RF signal terminal.

The second combiner 27 combines the fourth signal and the fifth signal to output a sixth signal.

Meanwhile, a second input signal input to the second input terminal 18 is in-phase-distributed into a seventh signal and an eighth signal to be input to the second quadrature mixer 32. The seventh signal is input to the baseband signal terminal of the third unit mixer 25, and the eighth signal is input to the baseband signal terminal of the fourth unit mixer 26.

The third unit mixer 25 multiplies the seventh signal and the LO wave of 270° input from the third LO input terminal 21 to output a ninth signal from the RF signal terminal. At this time, the baseband signal terminal of the third unit mixer 25 is connected to the second input terminal 18 with the polarity being inverted as illustrated in FIG. 8. Therefore, the seventh signal is input to the baseband signal terminal of the third unit mixer 25 with the polarity being inverted.

The fourth unit mixer 26 multiplies the eighth signal and the LO wave of 180° input from the fourth LO input terminal 22 to output a tenth signal from the RF signal terminal.

The third combiner 28 combines the ninth signal and the tenth signal to output an eleventh signal.

The first combiner 29 combines the sixth signal and the eleventh signal to output the combined signal from the first output terminal 30 to the outside.

In this manner, in the second embodiment, the quadrature mixers 31 and 32 are formed of the four unit mixers 23 to 26 having the same configuration. The quadrature-phase LO waves having phase differences of 90°, namely, the LO waves of 0°, 90°, 180°, and 270° are used for those four unit mixers, namely, the first unit mixer 23, the second unit mixer 24, the third unit mixer 25, and the fourth unit mixer 26, respectively. The first combiner 29, the second combiner 27, and the third combiner 28 are provided, and hence the output signals from the first quadrature mixer 31 and the second quadrature mixer 32 are combined. In addition, the input of the third unit mixer 25 configured to input the LO wave of 270° is connected to the second input terminal 18 at the previous stage with the polarity being inverted. The second embodiment and the first embodiment are different in that in the first embodiment, the RF signal terminal of the third unit mixer 9 is formed of a differential terminal and connected to the third combiner 12 at the subsequent stage with the differential terminal being inverted, while in the second embodiment, the baseband signal terminal of the third unit mixer 25 is formed of a differential terminal and connected to the second input terminal 18 at the previous stage with the differential terminal being inverted.

The configurations of the first quadrature mixer 31, the second quadrature mixer 32, the first combiner 29, the first unit mixer 23, the second unit mixer 24, the third unit mixer 25, the fourth unit mixer 26, the second combiner 27, and the third combiner 28 which are illustrated in FIG. 8 are merely examples, and are not limited thereto, and it is to be understood that components having other configurations may be used. In FIG. 8, the three combiners 27 to 29 are provided, but one combiner may be configured to combine the outputs of the four unit mixers 23 to 26.

Now, an operation of the mixer according to the second embodiment is described with reference to FIG. 9 to FIG. 17.

Figure 9:
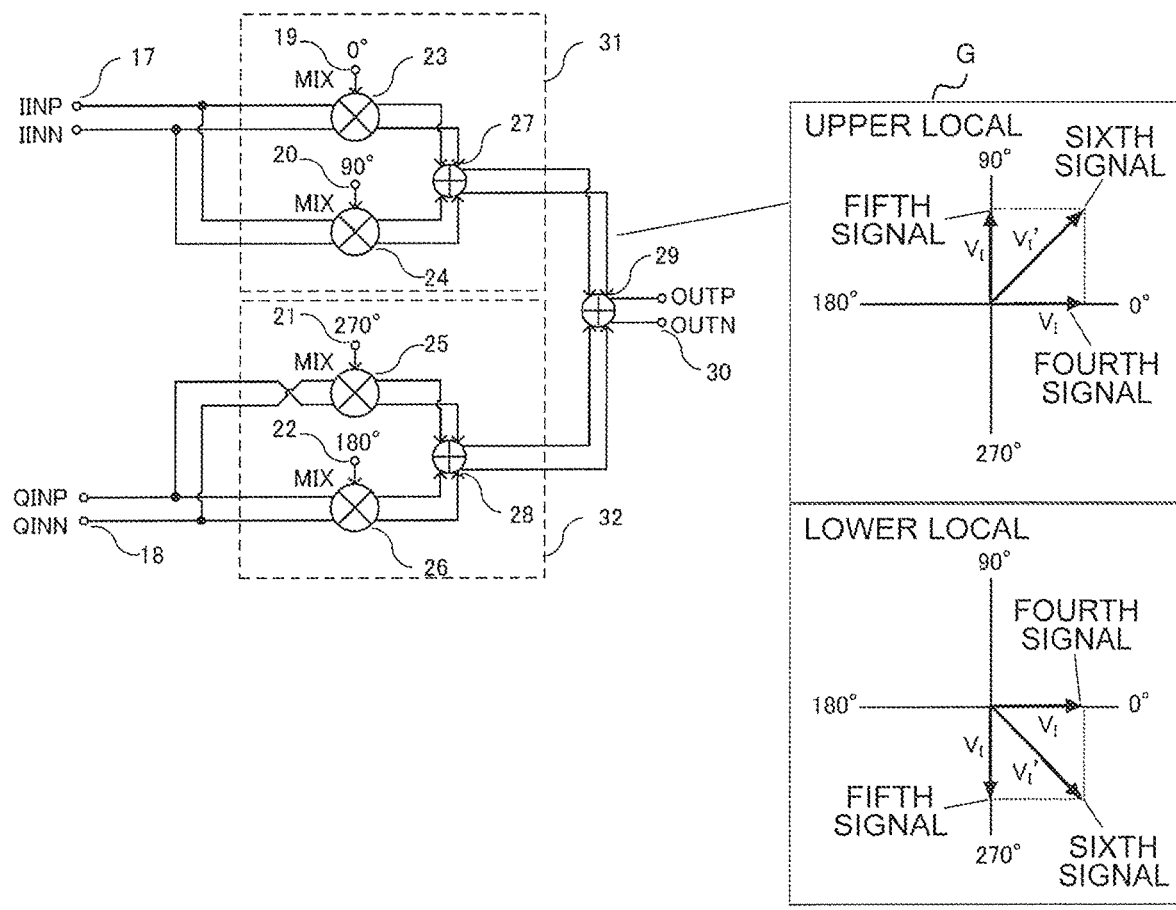
FIG. 9 is a diagram for illustrating a phase relationship between differential signals in an I-channel in the second embodiment.

FIG. 9 is a diagram for illustrating a phase relationship between differential signals in an I-channel in the second embodiment. When the amplitude of the fourth signal and the amplitude of the fifth signal are both set as $V_I$ and the amplitude of the sixth signal is set as $V_I'$, the phase and amplitude of the sixth signal are represented by a vector diagram indicated by reference symbol G of FIG. 9. In the vector diagram, an "upper local" case and a "lower local" case are each illustrated. The phases and amplitudes of the fourth signal, the fifth signal, and the sixth signal are as follows.

| <Upper Local> | | |
|---|---|---|
| Signal | Phase | Amplitude |
| Fourth signal | 0° | $V_I$ |
| Fifth signal | 90° | $V_I$ |
| Sixth signal | 45° | $V_I'$ |

| <Lower Local> | | |
|---|---|---|
| Signal | Phase | Amplitude |
| Fourth signal | 0° | $V_I$ |
| Fifth signal | 270° | $V_I$ |
| Sixth signal | 315° | $V_I'$ |

Figure 10:
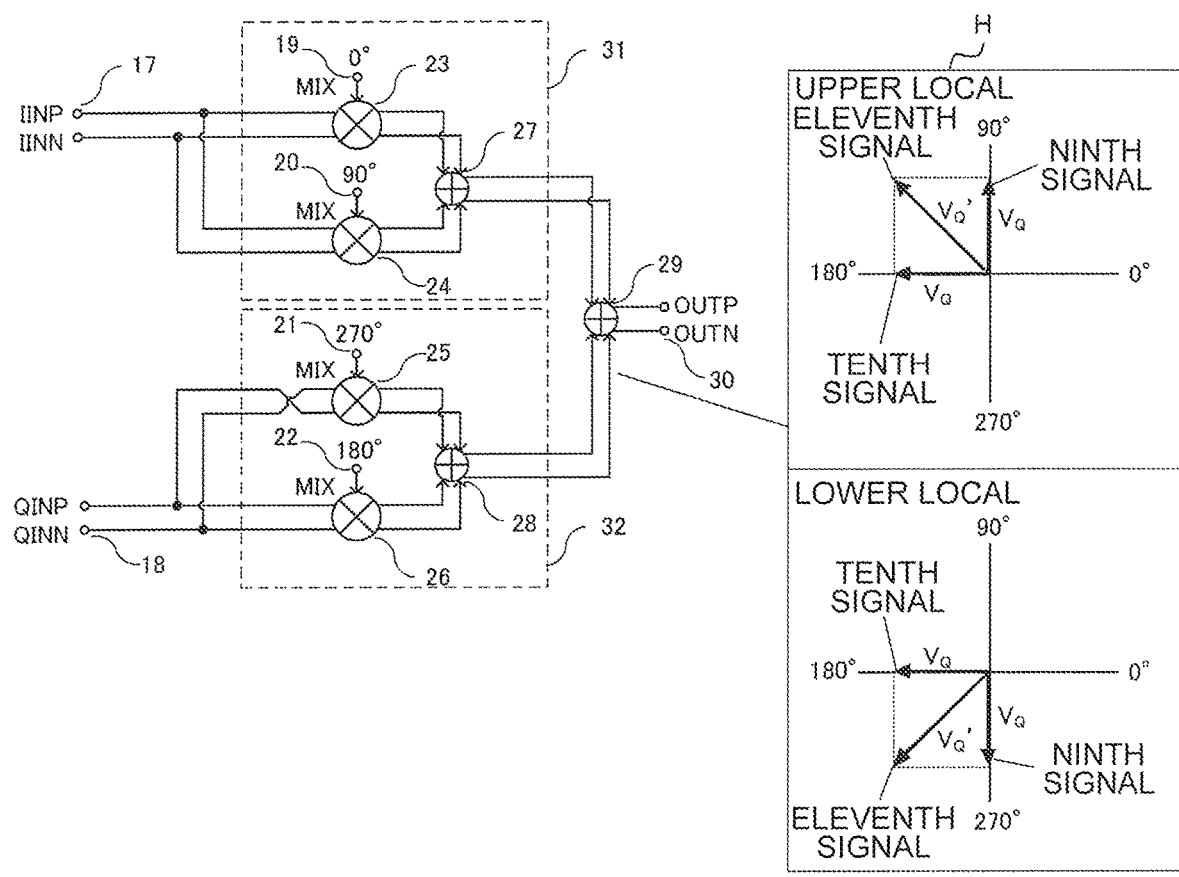
FIG. 10 is a diagram for illustrating a phase relationship between differential signals in a Q-channel in the second embodiment.

FIG. 10 is a diagram for illustrating a phase relationship between differential signals in a Q-channel in the second embodiment. As illustrated in FIG. 10, when the amplitude of the ninth signal and the amplitude of the tenth signal are both set as $V_Q$ and the amplitude of the eleventh signal is set as $V_Q'$, the phase and amplitude of the eleventh signal are represented by a vector diagram indicated by reference symbol H of FIG. 10. In the vector diagram, an "upper local" case and a "lower local" case are each illustrated. The phases and amplitudes of the ninth signal, the tenth signal, and the eleventh signal are as follows.

| <Upper Local> | | |
|---|---|---|
| Signal | Phase | Amplitude |
| Ninth signal | 90° | $V_Q$ |
| Tenth signal | 180° | $V_Q$ |
| Eleventh signal | 135° | $V_Q'$ |

| <Lower Local> | | |
|---|---|---|
| Signal | Phase | Amplitude |
| Ninth signal | 270° | $V_Q$ |
| Tenth signal | 180° | $V_Q$ |
| Eleventh signal | 225° | $V_Q'$ |

Figure 11:
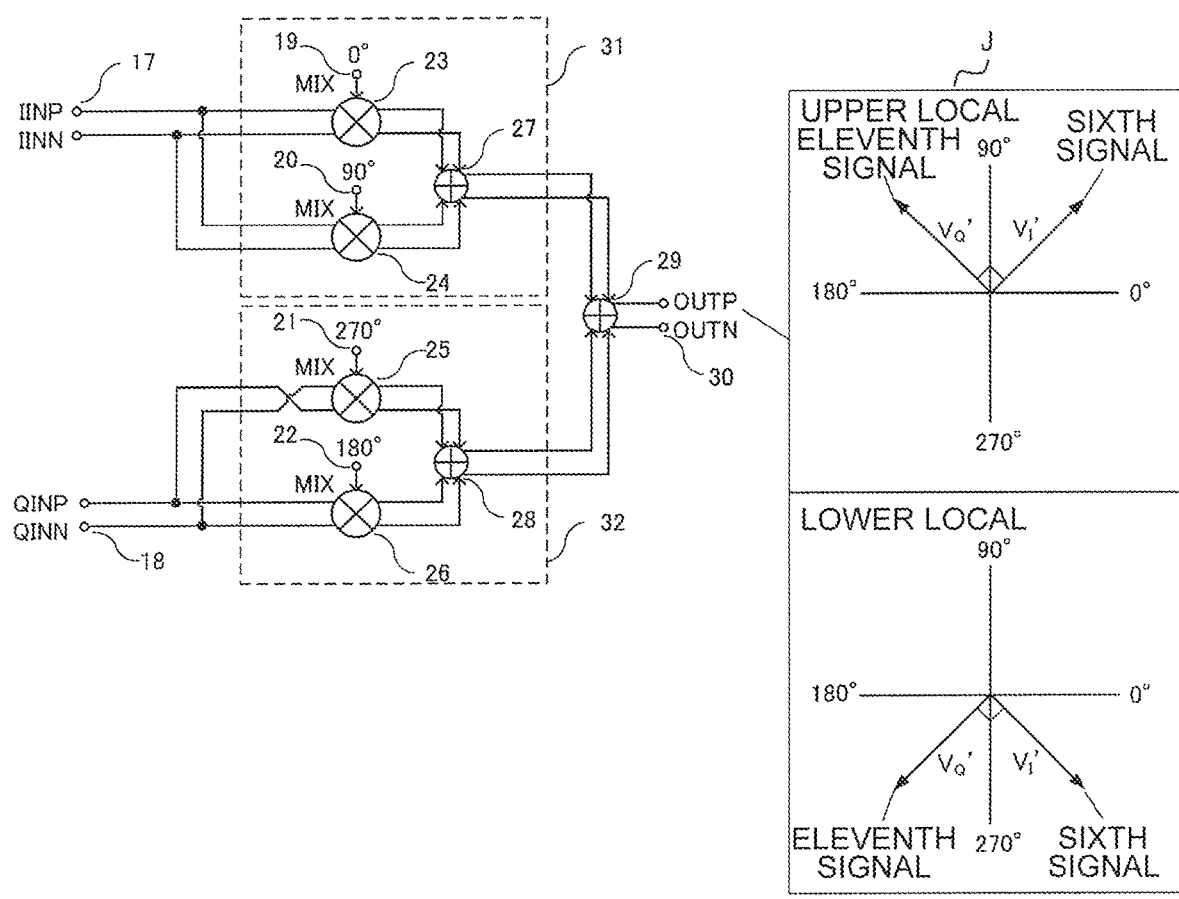
FIG. 11 is a diagram for illustrating a phase relationship between differential signals that have been combined in the second embodiment.

FIG. 11 is a diagram for illustrating a phase relationship between differential signals that have been combined in the second embodiment. The phases and amplitudes of the sixth signal and the eleventh signal at the first output terminal 30 are represented by a vector diagram indicated by reference symbol J of FIG. 11. In the vector diagram, an "upper local" case and a "lower local" case are each illustrated. The phases and amplitudes of the sixth signal and the eleventh signal are as follows.

| <Upper Local> | | |
|---|---|---|
| Signal | Phase | Amplitude |
| Sixth signal | 45° | $V_I'$ |
| Eleventh signal | 135° | $V_Q'$ |

| <Lower Local> | | |
|---|---|---|
| Signal | Phase | Amplitude |
| Sixth signal | 315° | $V_I'$ |
| Eleventh signal | 225° | $V_Q'$ |

In this manner, the signal in the I-channel and the signal in the Q-channel are orthogonal to each other, and hence the mixer according to the second embodiment operates as a quadrature mixer.

Figure 12:
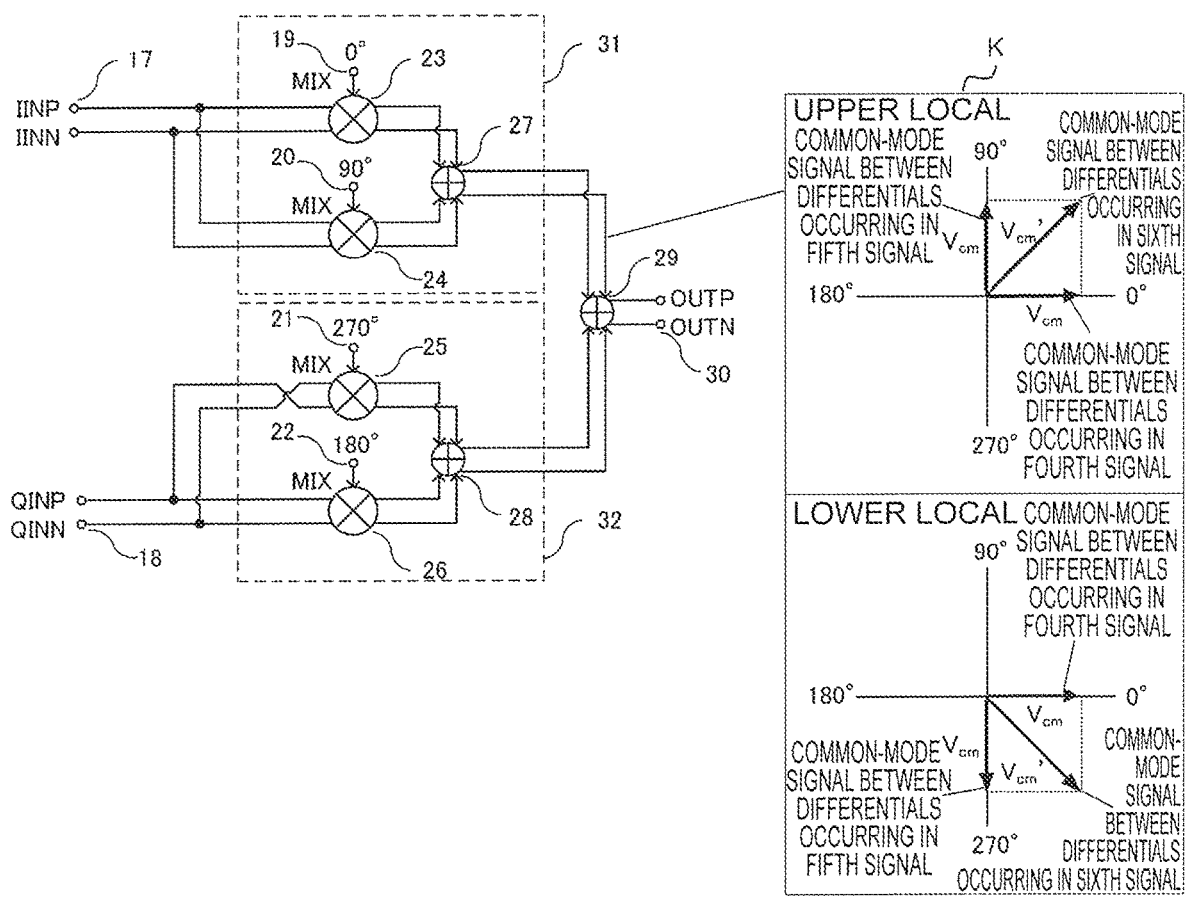
FIG. 12 is a diagram for illustrating a phase relationship between common-mode signals in the I-channel in the second embodiment.

FIG. 12 is a diagram for illustrating a phase relationship between common-mode signals in the I-channel in the second embodiment. When the amplitudes of common-mode signals between differentials occurring in the fourth signal and the fifth signal are both set as $V_{cm}$ and the amplitude of a common-mode signal between differentials occurring in the sixth signal is set as $V_{cm}'$, the phase and amplitude of the common-mode signal between the differentials occurring in the sixth signal is represented by a vector diagram indicated by reference symbol K of FIG. 12. In the vector diagram, an "upper local" case and a "lower local" case are each illustrated. The phases and amplitudes of the common-mode signal between the differentials occurring in the fourth signal, the common-mode signal between the differentials occurring in the fifth signal, and the common-mode signal between the differentials occurring in the sixth signal are as follows.

| <Upper Local> | | |
|---|---|---|
| Signal | Phase | Amplitude |
| Common-mode signal between differentials occurring in fourth signal | 0° | $V_{cm}$ |
| Common-mode signal between differentials occurring in fifth signal | 90° | $V_{cm}$ |
| Common-mode signal between differentials occurring in sixth signal | 45° | $V_{cm}'$ |

| <Lower Local> | | |
|---|---|---|
| Signal | Phase | Amplitude |
| Common-mode signal between differentials occurring in fourth signal | 0° | $V_{cm}$ |
| Common-mode signal between differentials occurring in fifth signal | 270° | $V_{cm}$ |
| Common-mode signal between differentials occurring in sixth signal | 315° | $V_{cm}'$ |

Figure 13:
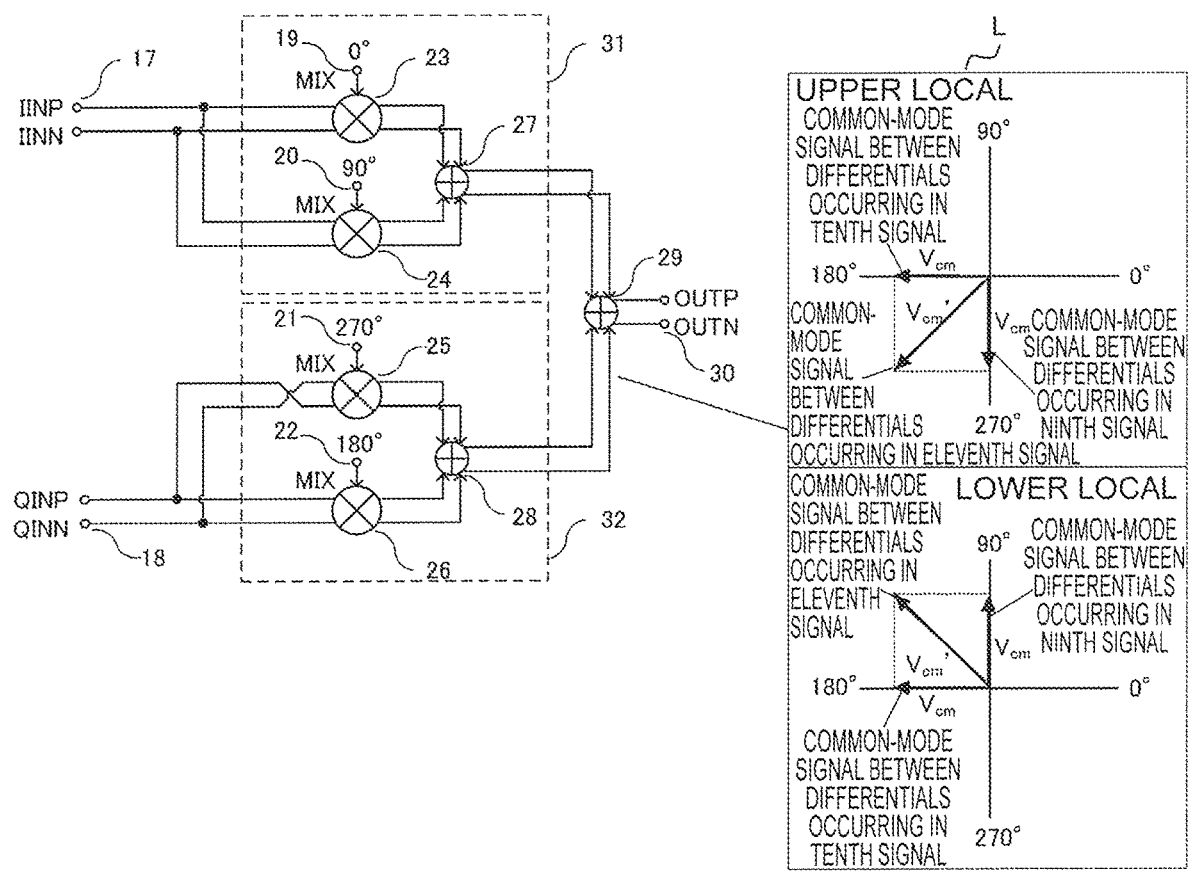
FIG. 13 is a diagram for illustrating a phase relationship between common-mode signals in the Q-channel in the second embodiment.

FIG. 13 is a diagram for illustrating a phase relationship between common-mode signals in the Q-channel in the second embodiment. When the amplitudes of common-mode signals between differentials occurring in the ninth signal and the tenth signal are both set as $V_{cm}$ and the amplitude of a common-mode signal between differentials occurring in the eleventh signal is set as $V_{cm}'$, the phase and amplitude of the common-mode signal between the differentials occurring in the eleventh signal is represented by a vector diagram indicated by reference symbol L of FIG. 13. In the vector diagram, an "upper local" case and a "lower local" case are each illustrated. The phases and amplitudes of the common-mode signal between the differentials occurring in the ninth signal, the common-mode signal between the differentials occurring in the tenth signal, and the common-mode signal between the differentials occurring in the eleventh signal are as follows.

<Upper Local>

| Signal | Phase | Amplitude |
|---|---|---|
| Common-mode signal between differentials occurring in ninth signal | 270° | $V_{cm}$ |
| Common-mode signal between differentials occurring in tenth signal | 180° | $V_{cm}$ |
| Common-mode signal between differentials occurring in eleventh signal | 225° | $V_{cm}'$ |

<Lower Local>

| Signal | Phase | Amplitude |
|---|---|---|
| Common-mode signal between differentials occurring in ninth signal | 90° | $V_{cm}$ |
| Common-mode signal between differentials occurring in tenth signal | 180° | $V_{cm}$ |
| Common-mode signal between differentials occurring in eleventh signal | 135° | $V_{cm}'$ |

Figure 14:
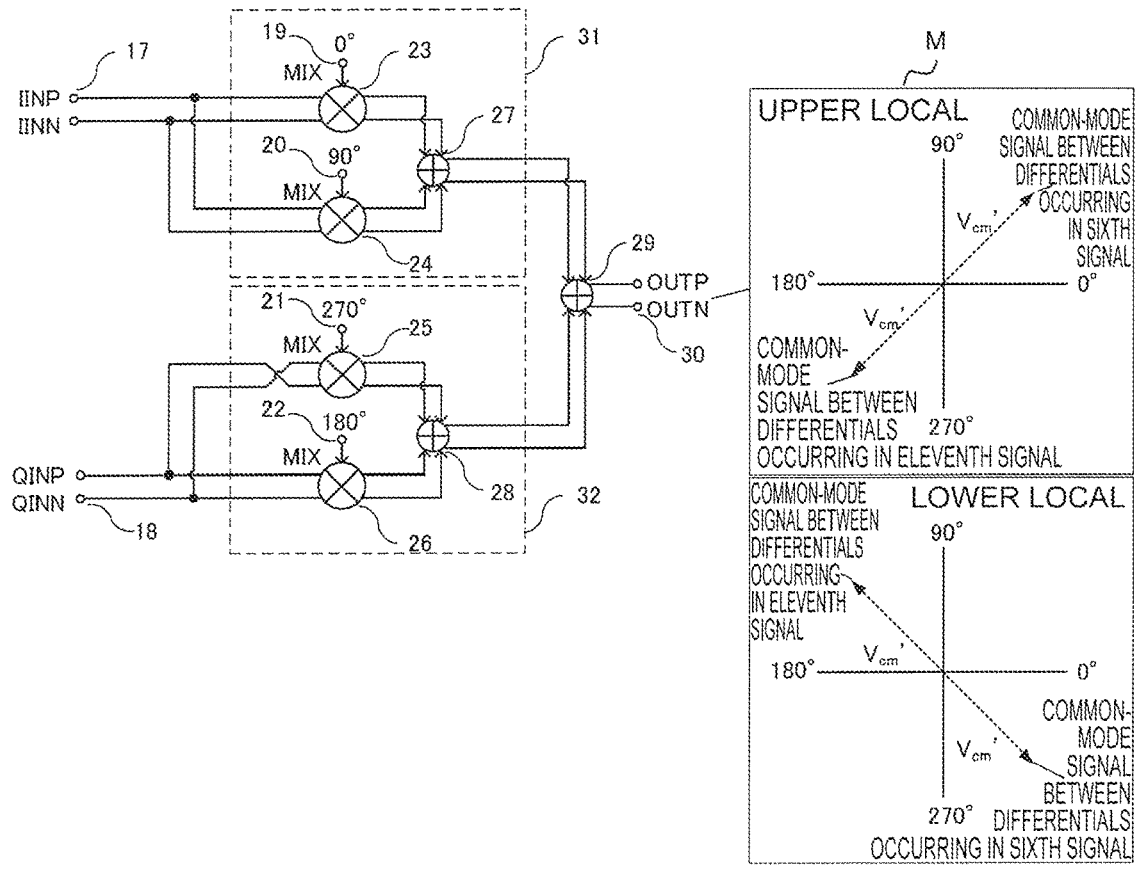
FIG. 14 is a diagram for illustrating a phase relationship between common-mode signals that have been combined in the second embodiment.

FIG. 14 is a diagram for illustrating a phase relationship between common-mode signals that have been combined in the second embodiment. The phases and amplitudes of the sixth signal and the eleventh signal at the first output terminal 30 are represented by a vector diagram indicated by reference symbol M of FIG. 14. In the vector diagram, an "upper local" case and a "lower local" case are each illustrated. The phases and amplitudes of the sixth signal and the eleventh signal are as follows.

<Upper Local>

| Signal | Phase | Amplitude |
|---|---|---|
| Sixth signal | 45° | $V_{cm}'$ |
| Eleventh signal | 225° | $V_{cm}'$ |

<Lower Local>

| Signal | Phase | Amplitude |
|---|---|---|
| Sixth signal | 315° | $V_{cm}'$ |
| Eleventh signal | 135° | $V_{cm}'$ |

In this manner, in the mixer according to the second embodiment, the common-mode signal in the I channel and the common-mode signal in the Q channel are combined so as to have the same amplitude and opposite phases, and hence the common-mode signals are canceled.

When isolation between an LO input terminal and the RF signal terminal cannot be sufficiently secured in each unit mixer, an LO wave leaks from the LO input terminal to the RF signal terminal and appears as an LO leak at the output terminal. With this configuration, it is possible to suppress the above-mentioned LO leak. A reason therefor is described below.

Figure 15:
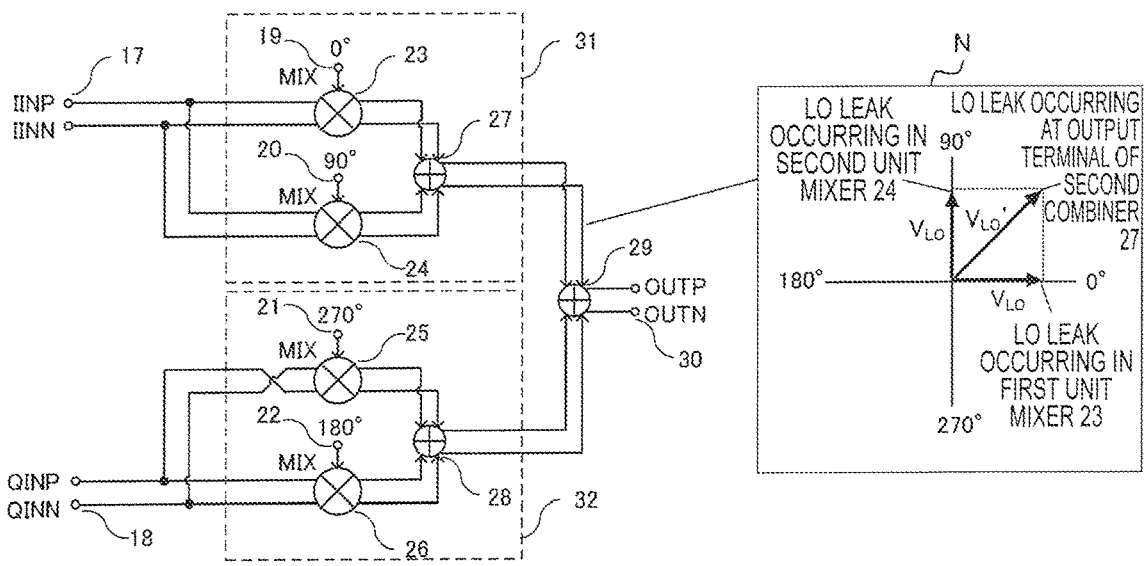
FIG. 15 is a diagram for illustrating a phase relationship between LO leaks in the I-channel in the second embodiment.

FIG. 15 is a diagram for illustrating a phase relationship between LO leaks in the I-channel in the second embodiment. When the amplitudes of the LO leaks occurring in the first unit mixer 23 and the second unit mixer 24 are both set as $V_{LO}$ and the amplitude of the LO leak occurring at the output terminal of the second combiner 27 is set as $V_{LO}'$, the phases and amplitudes of the LO leak occurring at the output terminal of the second combiner 27 is represented by a vector diagram indicated by reference symbol N of FIG. 15. In the vector diagram, an "upper local" case and a "lower local" case are each illustrated. The phases and amplitudes of the LO leak occurring in the first unit mixer 23, the LO leak occurring in the second unit mixer 24, and the LO leak occurring at the output terminal of the second combiner 27 are as follows.

| Signal | Phase | Amplitude |
|---|---|---|
| LO leak occurring in first unit mixer 23 | 0° | $V_{LO}$ |
| LO leak occurring in second unit mixer 24 | 90° | $V_{LO}$ |
| LO leak occurring at output terminal of second combiner 27 | 45° | $V_{LO}'$ |

Figure 16:
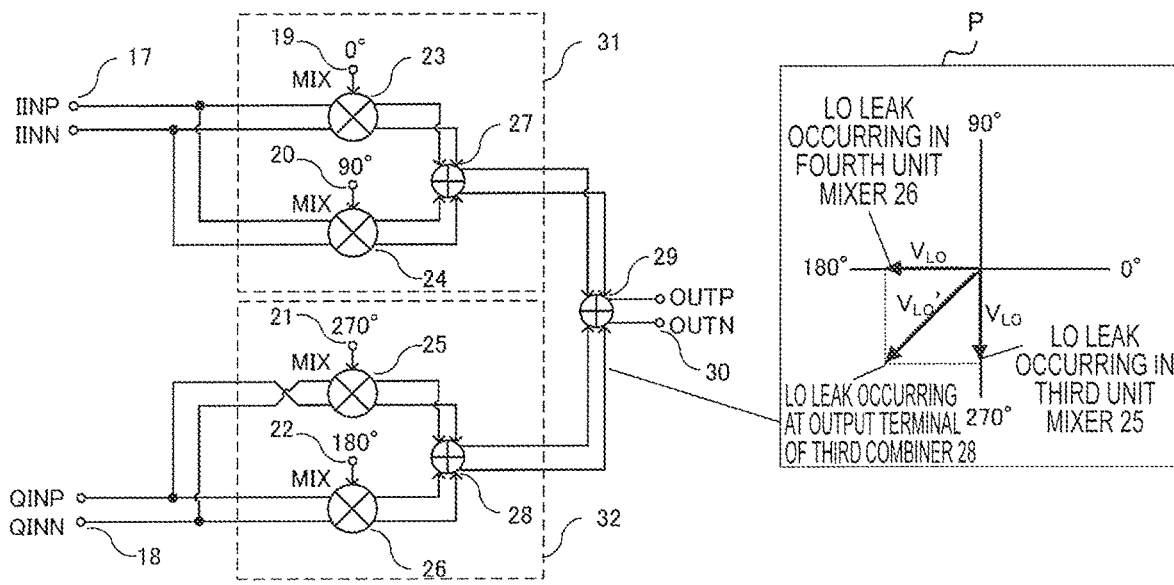
FIG. 16 is a diagram for illustrating a phase relationship between LO leaks in the Q-channel in the second embodiment.

FIG. 16 is a diagram for illustrating a phase relationship between LO leaks in the Q-channel in the second embodiment. When the amplitudes of the LO leaks occurring in the third unit mixer 25 and the fourth unit mixer 26 are both set as $V_{LO}$ and the amplitude of the LO leak occurring at the output terminal of the third combiner 28 is set as $V_{LO}'$, the phases and amplitudes of the LO leak occurring at the output terminal of the third combiner 28 is represented by a vector diagram indicated by reference symbol P of FIG. 16. In the vector diagram, an "upper local" case and a "lower local" case are each illustrated. The phases and amplitudes of the LO leak occurring in the third unit mixer 25, the LO leak occurring in the fourth unit mixer 26, and the LO leak occurring at the output terminal of the third combiner 28 are as follows.

| Signal | Phase | Amplitude |
|---|---|---|
| LO leak occurring in third unit mixer 25 | 270° | $V_{LO}$ |
| LO leak occurring in fourth unit mixer 26 | 180° | $V_{LO}$ |
| LO leak occurring at output terminal of third combiner 28 | 225° | $V_{LO}'$ |

Figure 17:
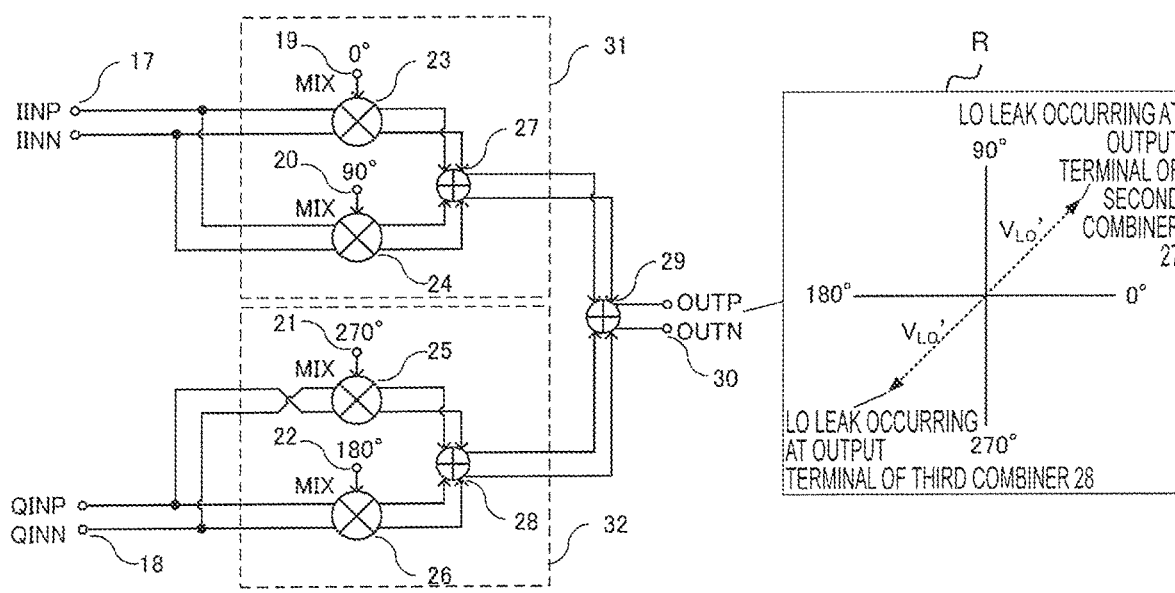
FIG. 17 is a diagram for illustrating a phase relationship between LO leaks that have been combined in the second embodiment.

FIG. 17 is a diagram for illustrating a phase relationship between LO leaks that have been combined in the second embodiment. The phases and amplitudes of the LO leak occurring at the output terminal of the second combiner 27 and the LO leak occurring at the output terminal of the third combiner 28 at the first output terminal 30 is represented by a vector diagram indicated by reference symbol R of FIG. 17. In the vector diagram, an "upper local" case and a "lower local" case are each illustrated. The phases and amplitudes of the LO leak occurring at the output terminal of the second combiner 27 and the LO leak occurring at the output terminal of the third combiner 28 are as follows.

| Signal | Phase | Amplitude |
| --- | --- | --- |
| LO leak occurring at output terminal of the second combiner 27 | 45° | $V_{LO}'$ |
| LO leak occurring at output terminal of the third combiner 28 | 225° | $V_{LO}'$ |

In this manner, in the mixer according to the second embodiment, the LO leak in the I-channel and the LO leak in the Q-channel are combined so as to have the same amplitude and opposite phases, and hence the LO leaks are canceled.

As described above, in the second embodiment, the first quadrature mixer 31 and the second quadrature mixer 32 are formed of the four unit mixers 23 to 26 having the same configuration. Further, through use of the first LO wave oscillator and the second LO wave oscillator that differ in phase by 180°, the quadrature-phase LO waves having phase differences of 90° are used for those four unit mixers, namely, the first unit mixer 23, the second unit mixer 24, the third unit mixer 25, and the fourth unit mixer 26, respectively. Further, the first combiner 29, the second combiner 27, and the third combiner 28 are provided, and hence the output signals from the first quadrature mixer 31 and the second quadrature mixer 32 are combined to cancel the common-mode signal components. That is, the output of the first quadrature mixer 31 operating with the LO waves of 0° and 90° and the output of the second quadrature mixer 32 operating with the LO waves of 180° and 270° being the LO waves of the phases opposite to those of the first quadrature mixer 31 are combined to cancel the output signals. However, when the LO waves of the opposite phases are simply used, the differential signals and the common-mode signals are both canceled, and hence, in the second embodiment, only one differential terminal is inverted to be connected to the second input terminal 18. With this configuration, the polarity of the differential signal is inverted before and after the portion at which the differential terminal is inverted, and the polarity of the common-mode signal remains the same. Therefore, in terms of the differential signal, a signal equivalent to that of a normal mixer can be obtained, and only a common-mode signal can be canceled. As a result, this configuration can suppress unnecessary spurious responses that occur when a common-mode component, for example, power supply noise, is mixed into the differential input.

For the above-mentioned reasons, it is possible to form a mixer capable of canceling a common-mode signal between differentials and an LO leak through use of this configuration. Further, although the phase relationship between the I channel and the Q channel is changed, even when a baseband signal terminal formed of a differential terminal of one unit mixer of the first to fourth unit mixers 23 to 26 is inverted and connected, the same operation can be achieved. Further, as long as the first, second, third, and fourth unit mixers have the same configuration, the RF signal terminal may be single-phase. Further, in the second embodiment, when a 90° phase difference splitting unit is provided at the previous stage of the first input terminal 17 and the second input terminal 18, the mixer according to the second embodiment can also be configured to operate as an image rejection mixer. That is, the third input signal is input to the 90° phase difference splitting unit. Thus, the 90° phase difference splitting unit generates the first input signal to be input to the first input terminal 17 and the second signal to be input to the second input terminal 18 from the third input signal. The 90° phase difference splitting unit may be formed of, for example, a 90° phase difference splitter and a 90° phase shifter, or may be formed of an in-phase splitter and a 90° phase shifter.

Third Embodiment

Figure 18:
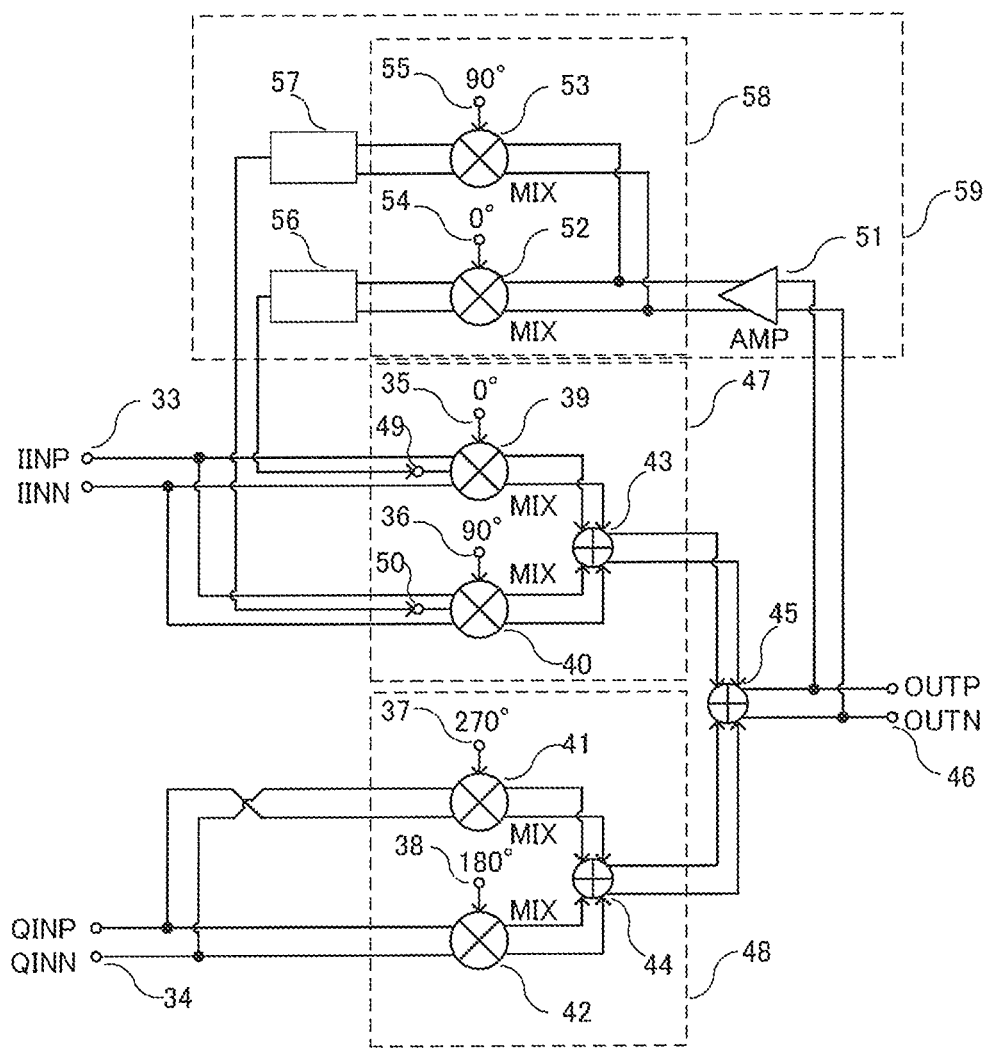
FIG. 18 is a diagram for illustrating one configuration example of a mixer for transmission according to a third embodiment of the present invention.

FIG. 18 is a diagram for illustrating one configuration example of a mixer according to a third embodiment of the present invention. The mixer according to the third embodiment includes a first input terminal 33, a second input terminal 34, a first mixer 45, a first output terminal 46, a first quadrature mixer 47, a second quadrature mixer 48, and a feedback circuit 59.

The first quadrature mixer 47 includes a first unit mixer 39, a second unit mixer 40, and a second combiner 43.

The first unit mixer 39 includes a baseband signal terminal, an RF signal terminal, a first LO input terminal 35, and a first LO leak control terminal 49. The baseband signal terminal and the RF signal terminal of the first unit mixer 39 are each formed of a differential terminal. The LO wave having the phase of 0° is input to the first LO input terminal 35 as a first LO wave. A signal for controlling the amplitude and polarity of an LO leak is input to the first LO leak control terminal 49.

The second unit mixer 40 includes a baseband signal terminal, an RF signal terminal, a second LO input terminal 36, and a second LO leak control terminal 50. The baseband signal terminal and the RF signal terminal of the second unit mixer 40 are each formed of a differential terminal. The LO wave having the phase of 90° is input to the second LO input terminal 36 as a second LO wave. A signal for controlling the amplitude and polarity of an LO leak is input to the second LO leak control terminal 50.

The second combiner 43 is configured to combine the output signal from the first unit mixer 39 and the output signal from the second unit mixer 40. Both the first LO wave and the second LO wave are oscillated from a first LO wave oscillator (not shown). The first LO wave oscillator is, for example, a quadrature oscillator.

The second quadrature mixer 48 includes a third unit mixer 41, a fourth unit mixer 42, and a third combiner 44.

The third unit mixer 41 includes a baseband signal terminal, an RF signal terminal, and a third LO input terminal 37. The baseband signal terminal and the RF signal terminal of the third unit mixer 41 are each formed of a differential terminal. The LO wave having the phase of 270° is input to the third LO input terminal 37 as a third LO wave.

The baseband signal terminal of the third unit mixer 41 is connected to the second input terminal 34 with its polarity being inverted. In other words, a terminal on the positive phase side of the baseband signal terminal is connected to a terminal on the negative phase side of the second input terminal 34, and a terminal on the negative phase side of the baseband signal terminal is connected to a terminal on the positive phase side of the second input terminal 34.

The fourth unit mixer 42 includes a baseband signal terminal, an RF signal terminal, and a fourth LO input terminal 38. The baseband signal terminal and the RF signal terminal of the fourth unit mixer 42 are each formed of a differential terminal. The LO wave having the phase of 180° is input to the fourth LO input terminal 38 as a fourth LO wave.

The third combiner 44 is configured to combine the output signal from the third unit mixer 41 and the output signal from the fourth unit mixer 42. Both the third LO wave and the fourth LO wave are oscillated from a second LO wave oscillator (not shown). The second LO wave oscillator is, for example, a quadrature oscillator.

A first input signal input to the first input terminal 33 is in-phase-distributed into a second signal and a third signal to be input to the first quadrature mixer 47. The second signal is input to the baseband signal terminal of the first unit mixer 39, and the third signal is input to the baseband signal terminal of the second unit mixer 40.

A second input signal input to the second input terminal 34 is in-phase-distributed into a seventh signal and an eighth signal to be input to the second quadrature mixer 48. The seventh signal is input to the baseband signal terminal of the third unit mixer 41, and the eighth signal is input to the baseband signal terminal of the fourth unit mixer 42.

The first combiner 45 is configured to combine the output signal from the first quadrature mixer 47 and the output signal from the second quadrature mixer 48 and to output the combined signal to the first output terminal 46.

The feedback circuit 59 includes an amplifier 51, a first bias control circuit 56, a second bias control circuit 57, and a third quadrature mixer 58.

The amplifier 51 includes a differential input terminal and a differential output terminal. The amplifier 51 is an amplifier of a gain Ga. The input terminal of the amplifier 51 is connected to the first combiner 45. The output terminal of the amplifier 51 is connected to the third quadrature mixer 58.

The first bias control circuit 56 includes a differential input terminal and a differential output terminal. The second bias control circuit 57 includes a differential input terminal and a differential output terminal. However, in FIG. 18, those differential output terminals are each simplified and represented as a single-phase output terminal.

The first bias control circuit 56 and the second bias control circuit 57 each include analog circuits, for example, an operational amplifier and a transistor.

The output terminal of the first bias control circuit 56 is connected to the first LO leak control terminal 49 of the first unit mixer 39. The first LO leak control terminal 49 is a differential input terminal. The output terminal of the second bias control circuit 57 is connected to the second LO leak control terminal 50 of the second unit mixer 40. The second LO leak control terminal 50 is a differential input terminal. However, in FIG. 18, the first LO leak control terminal 49 and the second LO leak control terminal 50 are each simplified and represented as a single-phase input terminal.

The third quadrature mixer 58 includes a fifth unit mixer 52 and a sixth unit mixer 53.

The fifth unit mixer 52 includes a fifth RF signal terminal, a fifth LO input terminal 54, and a fifth baseband signal terminal. The fifth RF signal terminal and the fifth baseband signal terminal are each a differential terminal. A fifth LO wave having the same phase as that of the first LO wave is input to the fifth LO input terminal 54. That is, the LO wave having the phase of 0° is input to the fifth LO input terminal 54 as a fifth LO wave. The fifth baseband signal terminal is configured to output a signal obtained by multiplying a signal input to the fifth RF signal terminal and the fifth LO wave input to the fifth LO input terminal 54.

The sixth unit mixer 53 includes a sixth RF signal terminal, a sixth LO input terminal 55, and a sixth baseband signal terminal. The sixth RF signal terminal and the sixth baseband signal terminal are each a differential terminal. A sixth LO wave having the same phase as that of the second LO wave is input to the sixth LO input terminal 55. That is, the LO wave having the phase of 90° is input to the sixth LO input terminal 55 as a sixth LO wave. The sixth baseband signal terminal is configured to output a signal obtained by multiplying a signal input to the sixth RF signal terminal and the sixth LO wave input to the sixth LO input terminal 55.

Both the fifth LO wave and the sixth LO wave are oscillated from a third LO wave oscillator (not shown). The third LO wave oscillator is, for example, a quadrature oscillator.

A signal output from the output terminal of the amplifier 51 is in-phase-distributed into the fifth RF signal terminal and the sixth RF signal terminal. That is, a signal from the first combiner 45 is input to the fifth RF signal terminal through the amplifier 51. In the same manner, the signal from the first combiner 45 is input to the sixth RF signal terminal through the amplifier 51. The fifth baseband signal terminal is connected to the input terminal of the first bias control circuit 56. The sixth baseband signal terminal is connected to the input terminal of the second bias control circuit 57.

In this manner, the amplifier 51 is provided between the fifth unit mixer 52 and sixth unit mixer 53 and the first combiner 45. The amplifier 51 is configured to pass therethrough a signal from the output terminal of the first combiner 45 toward the fifth RF signal terminal and a signal from the output terminal of the first combiner 45 toward the sixth RF signal terminal. Meanwhile, the amplifier 51 is configured to cut off a signal from the fifth RF signal terminal toward the output terminal of the first combiner 45 and the signal from the sixth RF signal terminal toward the output terminal of the first combiner 45. That is, the amplifier 51 can be referred to as a directional device.

Figure 20:
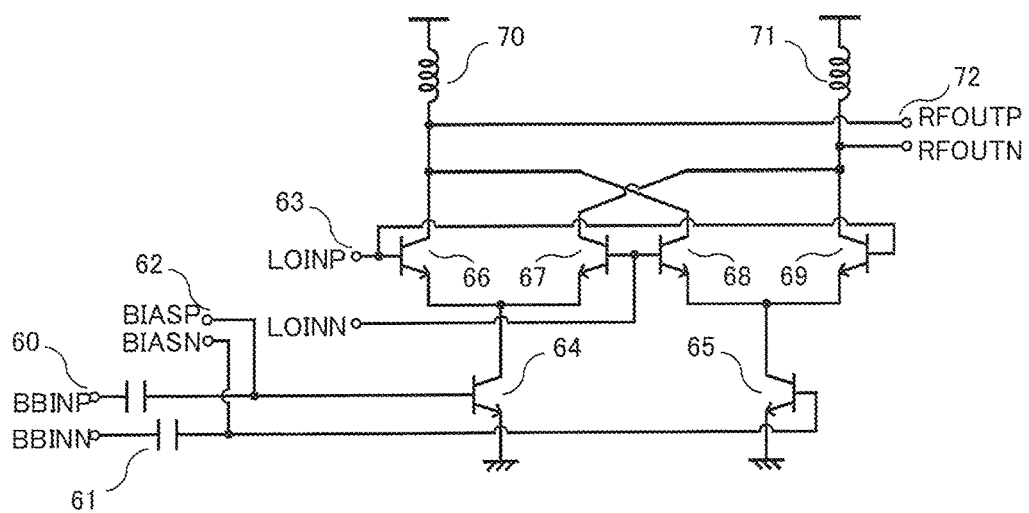
FIG. 20 is a diagram for illustrating one configuration example of a first unit mixer according to the third embodiment.

FIG. 20 is a diagram for illustrating one configuration example of the first unit mixer 39 according to the third embodiment. As illustrated in FIG. 20, the first unit mixer 39 is a differential double-balanced mixer of a Gilbert cell type.

A pair of baseband signal terminals 60 of FIG. 20, namely, "BBINP" and "BBINN" correspond to the baseband signal terminal of the first unit mixer 39. A pair of LO leak control terminals 62 of FIG. 20, namely, "BIASP" and "BIASN" correspond to the first LO leak control terminal 49. A pair of LO input terminals 63 of FIG. 20, namely, "LOINP" and "LOINN" correspond to the first LO input terminal 35. A pair of RF signal terminals 72 of FIG. 20, namely, "RFOUTP" and "RFOUTN" correspond to the RF signal terminal of the first unit mixer 39.

In the unit mixer having this configuration, a DC component of an input signal is cut off by a capacitor 61. Meanwhile, base voltages of a pair of bipolar transistors 64 and are independently controlled by the differential bias voltages input from the pair of LO leak control terminals 62. That is, a DC component of a positive phase signal of a baseband signal and a DC component of a negative phase signal of the baseband signal are controlled independently. An LO leak occurs due to frequency conversion of the DC component of the baseband signal. Therefore, the amplitude and polarity of the positive phase signal of an LO leak and the amplitude and polarity of the negative phase signal of the LO leak are controlled independently of each other.

The second unit mixer 40 has the same configuration as that of the first unit mixer 39.

As described above, the configuration of the mixer according to the third embodiment is a configuration in which the feedback circuit 59 is added to the mixer according to the second embodiment. Further, the output terminal of the first bias control circuit 56 is connected to the first LO leak control terminal 49, and the output terminal of the second bias control circuit 57 is connected to the second LO leak control terminal 50. That is, the configuration of the mixer is the same as that of the second embodiment except that the feedback circuit 59 is added and that the first unit mixer 39 and the second unit mixer 40 include the first LO leak control terminal 49 and the second LO leak control terminal 50, respectively.

Now, an operation of the mixer according to the third embodiment is described. As described in the second embodiment, the LO leak occurs when each LO wave leaks from the LO input terminal of each unit mixer to the RF signal terminal. However, the LO leak may also occur due to an imbalance of a differential circuit in each unit mixer due to manufacturing variations of each unit mixer.

When the mixer according to the third embodiment is operated under a state in which no signal is being input to each of the first input terminal 33 and the second input terminal 34, the LO leak due to the leakage of the LO wave is canceled in the same manner as in the mixer according to the second embodiment. Therefore, in this case, only the LO leak due to the manufacturing variations of each unit mixer occurs.

At this time, the first unit mixer 39 outputs a first LO leak from the RF signal terminal of the first unit mixer 39. The second unit mixer 40 outputs a second LO leak from the RF signal terminal of the second unit mixer 40. The third unit mixer 41 outputs a third LO leak from the RF signal terminal of the third unit mixer 41. The fourth unit mixer 42 outputs a fourth LO leak from the RF signal terminal of the fourth unit mixer 42.

The second combiner 43 combines the first LO leak and the second LO leak to output a fifth LO leak. The third combiner 44 combines the third LO leak and the fourth LO leak to output a sixth LO leak.

The first combiner 45 combines the fifth LO leak and the sixth LO leak. The LO leak combined by the first combiner 45 is in-phase-distributed into a seventh LO leak and an eighth LO leak. The seventh LO leak is output to the amplifier 51. The eighth LO leak is output to the outside from the first output terminal 46.

The amplifier 51 amplifies the seventh LO leak to output the amplified seventh LO leak as a ninth LO leak.

The ninth LO leak is input to the third quadrature mixer 58 to be in-phase-distributed into a tenth LO leak and an eleventh LO leak. The tenth LO leak is input to the RF signal terminal of the fifth unit mixer 52. The eleventh LO leak is input to the RF signal terminal of the sixth unit mixer 53.

The fifth unit mixer 52 multiplies the LO wave having the phase of 0° input from the fifth LO input terminal 54 and the tenth LO leak to output a twelfth signal from the baseband signal terminal of the fifth unit mixer 52.

The sixth unit mixer 53 multiplies the LO wave having the phase of 90° input from the sixth LO input terminal 55 and the eleventh LO leak to output a thirteenth signal from the baseband signal terminal of the sixth unit mixer 53.

The first bias control circuit 56 outputs a first bias voltage $V_{B1}$ corresponding to the magnitude of the input twelfth signal, namely, the signal output from the fifth baseband signal terminal. The second bias control circuit 57 outputs a second bias voltage $V_{B2}$ corresponding to the magnitude of the input thirteenth signal, namely, the signal output from the sixth baseband signal terminal.

The first bias voltage $V_{B1}$ is input to the first LO leak control terminal 49 of the first unit mixer 39. The second bias voltage $V_{B2}$ is input to the second LO leak control terminal 50 of the second unit mixer 40.

Now, an operation of the mixer according to the third embodiment is described in more detail with reference to FIG. 19.

Figure 19:
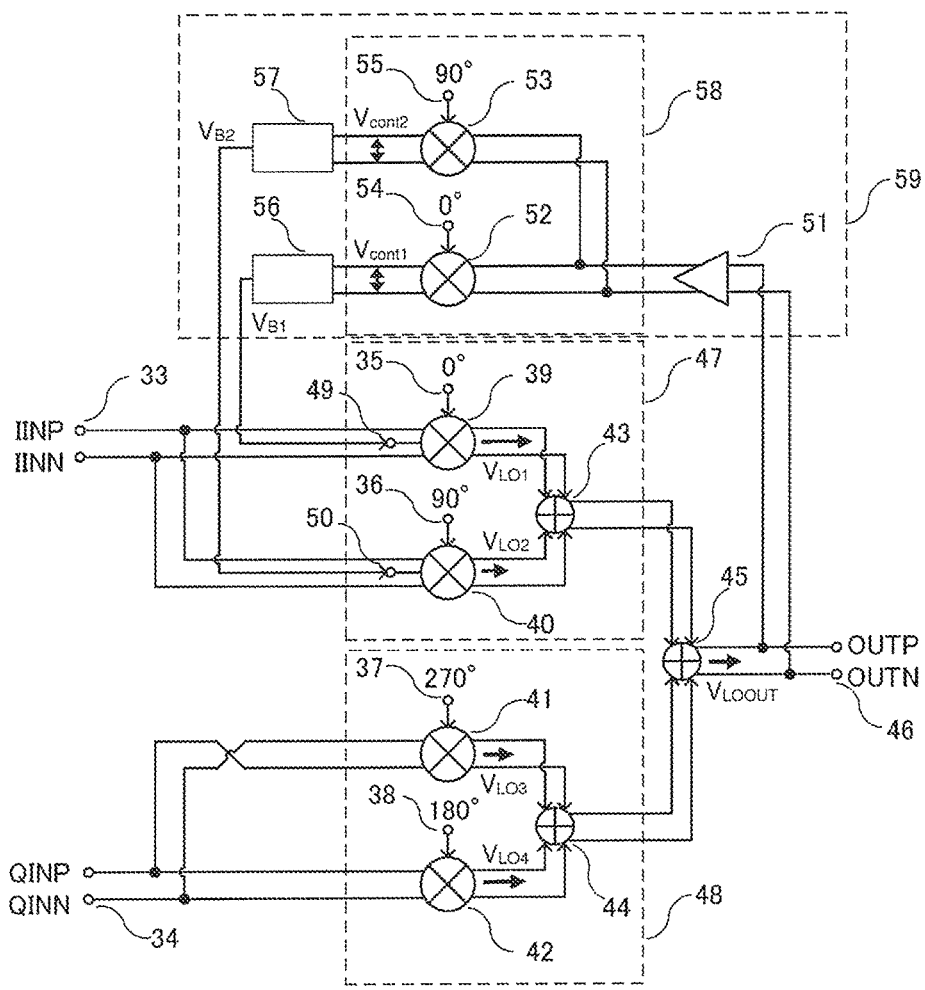
FIG. 19 is a diagram for illustrating LO leaks in the third embodiment.

FIG. 19 is a diagram for illustrating LO leaks in the mixer according to the third embodiment. In this case, no signal is input to each of the first input terminal 33 and the second input terminal 34. Reference symbol $V_{LO1}$ denotes a first LO leak occurring from the first unit mixer 39. Reference symbol $V_{LO2}$ denotes a second LO leak occurring from the second unit mixer 40. Reference symbol $V_{LO3}$ denotes a third LO leak occurring from the third unit mixer 41. Reference symbol $V_{LO4}$ denotes a fourth LO leak occurring from the fourth unit mixer 42.

Reference symbol $V_{LOOUT}$ denotes a seventh LO leak after being combined by the first combiner 45. Reference symbol $V_{cont1}$ denotes a signal in which the LO leak $V_{LOOUT}$ is down-converted by the fifth unit mixer 52, and corresponds to a twelfth LO leak. Reference symbol $V_{cont2}$ denotes a signal in which the LO leak $V_{LOOUT}$ is down-converted by the sixth unit mixer 53, and corresponds to a thirteenth LO leak. The LO wave having the phase of 0° is denoted by cos ωt, the LO wave having the phase of 90° is denoted by sin ωt, the LO wave having the phase of 180° is denoted by −cos ωt, and the LO wave having the phase of 270° is denoted by −sin ωt.

The amplitude of the first LO leak $V_{LO1}$, the amplitude of the second LO leak $V_{LO2}$, the amplitude of the third LO leak $V_{LO3}$, and the amplitude of the fourth LO leak $V_{LO4}$ are set as $\Delta V_1$, $\Delta V_2$, $\Delta V_3$, and $\Delta V_4$, respectively. At this time, the first LO leak $V_{LO1}$, the second LO leak $V_{LO2}$, the third LO leak $V_{LO3}$, and the fourth LO leak $V_{LO4}$ are expressed by Expression (1) to Expression (4), respectively.

$$V_{LO1} = \Delta V_1 \times \cos \omega t \tag{1}$$

$$V_{LO2} = \Delta V_2 \times \sin \omega t \tag{2}$$

$$V_{LO3} = -\Delta V_3 \times \sin \omega t \tag{3}$$

$$V_{LO4} = -\Delta V_4 \times \cos \omega t \tag{4}$$

Therefore, the seventh LO leak $V_{LOOUT}$ is expressed by the following expression.

$$V_{LOOUT} = (\Delta V_1 - \Delta V_4) \times \cos \omega t + (\Delta V_2 - \Delta V_3) \times \sin \omega t \tag{5}$$

The gain of the amplifier 51 is Ga, and hence the twelfth LO leak $V_{cont1}$ and the thirteenth LO leak $V_{cont2}$ are expressed by Expression (6) and Expression (7), respectively.

$$V_{cont1} = Ga \times V_{LOCUT} \times \cos \omega t = \\ Ga/2 \times [(\Delta V_1 - \Delta V_4) \times (1 + \cos 2\omega t) + (\Delta V_2 - \Delta V_3) \times \sin 2\omega t] \tag{6}$$

$$V_{cont2} = Ga \times V_{LOCUT} \times \sin \omega t = \\ Ga/2 \times [(\Delta V_1 - \Delta V_4) \times \sin 2\omega t + (\Delta V_2 - \Delta V_3) \times (1 - \cos 2\omega t)] \tag{7}$$

When second harmonic components of the twelfth LO leak $V_{cont1}$ and the thirteenth LO leak $V_{cont2}$ are eliminated through use of a filter, for example, a low-pass filter, Expression (6) and Expression (7) become Expression (8) and Expression (9), respectively.

$$V_{cont1} = Ga \times (\Delta V_1 - \Delta \Delta V_4)/2 \tag{8}$$

$$V_{cont2} = Ga \times (\Delta V_2 - \Delta V_3)/2 \tag{9}$$

The first bias control circuit 56 outputs the first bias voltage $V_{B1}$ corresponding to the magnitude of the twelfth LO leak $V_{cont1}$ to the first LO leak control terminal 49. Thus, in the first unit mixer 39, the DC component of the baseband signal is controlled to change the amplitude $\Delta V_1$ and polarity of the first LO leak $V_{LO1}$.

The second bias control circuit 57 outputs the second bias voltage $V_{B2}$ corresponding to the magnitude of the thirteenth LO leak $V_{cont2}$ to the second LO leak control terminal 50. Thus, in the second unit mixer 40, the DC component of the baseband signal is controlled to change the amplitude $\Delta V_2$ and polarity of the second LO leak $V_{LO2}$.

A correspondence relationship between the magnitude of the twelfth LO leak $V_{cont1}$ and the first bias voltage $V_{B1}$ is set in advance so that the feedback control of the feedback circuit 59 becomes negative feedback control. A correspondence relationship between the magnitude of the thirteenth LO leak $V_{cont2}$ and the second bias voltage $V_{B2}$ is set in advance so that the feedback control of the feedback circuit 59 becomes negative feedback control.

More specifically, the twelfth LO leak $V_{cont1}$ and the first bias voltage $V_{B1}$ are associated with each other in advance so that the amplitude $\Delta V_1$ of the first LO leak becomes closer to the amplitude $\Delta V_4$ of the fourth LO leak. In the same manner, the thirteenth LO leak $V_{cont2}$ and the second bias voltage $V_{B2}$ are associated with each other in advance so that the amplitude $\Delta V_2$ of the second LO leak becomes closer to the amplitude $\Delta V_3$ of the third LO leak. Therefore, with this feedback control, the twelfth LO leak $V_{cont1}$ and the thirteenth LO leak $V_{cont2}$ each converge to 0, and the seventh LO leak $V_{LOOUT}$ converges to 0.

At this time, the amplitude $\Delta V_1$ of the first LO leak $V_{LO1}$ and the amplitude $\Delta V_4$ of the fourth LO leak $V_{LO4}$ are equal, and the phase of the first LO leak $V_{LO1}$ and the phase of the fourth LO leak $V_{LO4}$ are opposite in phase. In addition, the amplitude $\Delta V_2$ of the second LO leak $V_{LO2}$ and the amplitude $\Delta V_3$ of the third LO leak $V_{LO3}$ are equal, and the phase of the second LO leak $V_{LO2}$ and the phase of the third LO leak $V_{LO3}$ are opposite in phase.

In this manner, the feedback circuit 59 corrects the LO leaks due to the manufacturing variations of the first unit mixer 39, the second unit mixer 40, the third unit mixer 41, and the fourth unit mixer 42.

As described above, the mixer according to the third embodiment operates the feedback circuit 59 when the first input signal is not input to the first input terminal 33 and the second input signal is not input to the second input terminal 34. The mixer according to the third embodiment corrects the LO leak due to the manufacturing variations of each unit mixer by the feedback control of the feedback circuit 59. After the LO leaks are corrected, the mixer according to the third embodiment determines the first bias voltage $V_{B1}$ as a first reference voltage, and determines the second bias voltage $V_{B2}$ as a second reference voltage.

The mixer according to the third embodiment stops the operation of the feedback circuit 59 when the first input signal is input to the first input terminal 33 and the second input signal is input to the second input terminal 34. In addition, the mixer according to the third embodiment sets an output voltage from the first bias control circuit 56 as the first reference voltage, and sets an output voltage from the second bias control circuit 57 as the second reference voltage.

In other words, the first bias voltage $V_{B1}$ is held at the first reference voltage after the LO leaks due to the manufacturing variations of each unit mixer are corrected. In the same manner, the second bias voltage $V_{B2}$ is held at the second reference voltage.

With this configuration, the mixer according to the third embodiment can suppress not only the LO leaks due to the leakage of the LO wave and the common-mode signals between the differential terminals but also the LO leak due to the manufacturing variations of each unit mixer.

In the third embodiment, the baseband signal terminal of the third unit mixer 41 is connected to the second input terminal 34 with its polarity being inverted. However, the terminal having the polarity inverted may be the baseband signal terminal of the first unit mixer 39, the baseband signal terminal of the second unit mixer 40, or the baseband signal terminal of the fourth unit mixer 42.

Further, all the RF terminals of the first unit mixer 39, the second unit mixer 40, the third unit mixer 41, the fourth unit mixer 42, the fifth unit mixer 52, and the sixth unit mixer 53 may be single-phase.

Further, in each of the first unit mixer 39, the second unit mixer 40, the third unit mixer 41, and the fourth unit mixer 42 in the third embodiment, the baseband signal terminal and the RF signal terminal are both differential terminals. However, it suffices that at least the baseband signal terminal is a differential terminal.

Further, in the third embodiment, the first unit mixer 39 and the second unit mixer 40 are each a differential double-balanced mixer using a Gilbert cell. However, the first unit mixer 39 and the second unit mixer 40 may have any configuration as long as the first unit mixer 39 and the second unit mixer 40 are mixers capable of differentially and independently controlling the LO leak output from the RF signal terminal by controlling the DC component of the baseband signal.

Further, in the third embodiment, the phase of the fifth LO wave is set to 0°, and the phase of the sixth LO wave is set to 90°. That is, the fifth LO wave has the same phase as that of the first LO wave, and the sixth LO wave has the same phase as that of the second LO wave. However, the phase of the fifth LO wave may be set to 180°, and the phase of the sixth LO wave may be set to 270°. That is, the fifth LO wave may be set to have the same phase as that of the fourth LO wave, and the sixth LO wave may be set to have the same phase as that of the third LO wave. In this case, the fourth unit mixer 42 includes a first LO leak control terminal, and the third unit mixer 41 includes a second LO leak control terminal.

With this configuration, it is possible to suppress not only the LO leaks due to the leakage of the LO wave and the common-mode signals between the differential terminals but also the LO leak due to the manufacturing variations of each unit mixer.

Further, when the fifth LO wave is set to have the same phase as that of the first LO wave and the sixth LO wave is set to have the same phase as that of the second LO wave, the third LO wave oscillator may be omitted, and the fifth LO wave and the sixth LO wave may be oscillated from the first LO wave oscillator.

Further, when the fifth LO wave is set to have the same phase as that of the fourth LO wave and the sixth LO wave is set to have the same phase as that of the third LO wave, the third LO wave oscillator may be omitted, and the fifth LO wave and the sixth LO wave may be oscillated from the second LO wave oscillator.

Further, in the third embodiment, the phase of the first LO wave is set to 0°, and the phase of the second LO wave is set to 90°. However, it suffices that the phases of those LO waves are orthogonal to each other, and the phases are not limited to 0° and 90°. Further, in the third embodiment, the phase of the third LO wave is set to 270°, and the phase of the fourth LO wave is set to 180°. However, it suffices that the phases of those LO waves are orthogonal to each other, and the phases are not limited to 270° and 180°.

However, the phase of the LO wave oscillated from the first LO wave oscillator and the phase of the LO wave oscillated from the second LO wave oscillator are required to differ by 180°.

Further, in the third embodiment, the phase of the first LO wave and the phase of the fourth LO wave differ by 180°. However, for example, the phase of the first LO wave and the phase of the third LO wave may differ by 180°.

Further, in the same manner, in the third embodiment, the phase of the second LO wave and the phase of the third LO wave differ by 180°. However, for example, the phase of the second LO wave and the phase of the fourth LO wave may differ by 180°.

Further, when a 90° phase difference splitting unit is provided at the previous stage of the first input terminal 33 and the second input terminal 34 of the mixer according to the third embodiment, the mixer can be configured to operate as an image rejection mixer. When the third input signal is input to the 90° phase difference splitting unit, the first input signal and the second input signal are generated. For example, the 90° phase difference splitting unit may be a 90° phase difference splitter, or may be a combination of an in-phase splitter and a 90° phaser.

Further, in the third embodiment, the phases of the LO waves input to the LO input terminals 54 and 55 are set to 0° and 90°, but 180° and 270° may be used.

In the mixer according to the third embodiment, the frequency of the LO wave input to the fifth unit mixer 52 and the sixth unit mixer 53 is equal to the frequencies of the LO waves input to the first unit mixer 39, the second unit mixer 40, the third unit mixer 41, and the fourth unit mixer 42. However, the frequencies of the LO waves input to the fifth unit mixer 52 and the sixth unit mixer 53 may differ from the frequencies of the LO waves input to the first unit mixer 39, the second unit mixer 40, the third unit mixer 41, and the fourth unit mixer 42.

That is, when the frequency of the fifth LO wave may be set to have a value different from that of the frequency of the first LO wave, and the frequency of the sixth LO wave may be set to have a value different from that of the frequency of the second LO wave.

Alternatively, when the frequency of the fifth LO wave may be set to have a value different from that of the frequency of the fourth LO wave, and the frequency of the sixth LO wave may be set to have a value different from that of the frequency of the third LO wave.

With this configuration, it is possible to suppress influences of DC offset components ascribable to the manufacturing variations of the fifth unit mixer 52 and the sixth unit mixer 53 on the twelfth LO leak $V_{cont1}$ and the thirteenth LO leak $V_{cont2}$. However, the twelfth LO leak $V_{cont1}$ and the thirteenth LO leak $V_{cont2}$ are both AC components. Therefore, the first bias control circuit 56 is required to generate such a bias voltage as to cause the amplitude of the AC component of the twelfth LO leak $V_{cont1}$ to become 0. In the same manner, the second bias control circuit 57 is required to generate such a bias voltage as to cause the amplitude of the AC component of the thirteenth LO leak $V_{cont2}$ to become 0.

Further, in the third embodiment, the phase of the LO wave input to the fifth LO input terminal 54 and the phase of the LO wave input to the sixth LO input terminal 55 are 0° and 90°, respectively, but may be 180° and 270°, respectively.

Further, in the third embodiment, the amplifier 51 is used as the directional device, but for example, an isolator for RF may be used.

Further, when isolation between the fifth LO input terminal 54 and the output terminal 46 and isolation between the sixth LO input terminal 55 and the output terminal 46 are sufficiently secured, the amplifier 51 may be eliminated.

Further, the first bias control circuit 56 and the second bias control circuit 57 may include not only the analog circuit but also a digital circuit, for example, an A/D converter.

Further, the configuration of the mixer illustrated in FIG. 18 is merely an example, and the mixer is not limited thereto. In FIG. 18, the first combiner 45, the second combiner 43, and the third combiner 44 are used as the combiners, but may be formed of one combiner. That is, the output signal from the first unit mixer 39, the output signal from the second unit mixer 40, the output signal from the third unit mixer 41, and the output signal from the fourth unit mixer 42 may be combined into one combiner.

Further, the mixer according to the third embodiment is used as a mixer for transmission, but may be used as a mixer for reception.

Reference Signs List 1, 17, 33 first input terminal, 2, 18, 34 second input terminal, 3, 19, 35 first LO input terminal, 4, 20, 36 second LO input terminal, 5, 21, 37 third LO input terminal, 6, 22, 38 fourth LO input terminal, 7, 23, 39 first unit mixer, 8, 24, 40 second unit mixer, 9, 25, 41 third unit mixer, 10, 26, 42 fourth unit mixer, 11, 27, 43 second combiner, 12, 28, 44 third combiner, 13, 29, 45 first combiner, 14, 30, 46 first output terminal, 15, 31, 47 first quadrature mixer, 16, 32, 48 second quadrature mixer, 49 first LO leak control terminal, 50 second LO leak control terminal, 51 amplifier (directional device), 52 fifth unit mixer, 53 sixth unit mixer, 54 fifth LO input terminal, 55 sixth LO input terminal, 56 first bias control circuit, 57 second bias control circuit

The invention claimed is:

1. A mixer, comprising:
a first unit mixer, a second unit mixer, a third unit mixer, and a fourth unit mixer each having the same configuration including: a baseband signal terminal; an LO input terminal; and an RF signal terminal configured to output a signal obtained by multiplying a signal input to the baseband signal terminal and a local oscillation wave input to the LO input terminal, at least one of the baseband signal terminal and the RF signal terminal being formed of a differential terminal;
a first input terminal configured to receive input of a first input signal and in-phase-distribute the first input signal to supply common-mode signals to the baseband signal terminal of the first unit mixer and the baseband signal terminal of the second unit mixer;
a second input terminal configured to receive input of a second input signal and in-phase-distribute the second input signal to supply common-mode signals to the baseband signal terminal of the third unit mixer and the baseband signal terminal of the fourth unit mixer; and
a combiner configured to combine the signals output from the RF signal terminals of the first unit mixer, the second unit mixer, the third unit mixer, and the fourth unit mixer,
wherein a first local oscillation wave and a second local oscillation wave which are in an orthogonal relationship are input to the LO input terminal of the first unit mixer and the LO input terminal of the second unit mixer, respectively,
wherein a third local oscillation wave and a fourth local oscillation wave which are in an orthogonal relationship are input to the input terminal of the third unit mixer and the LO input terminal of the fourth unit mixer, respectively, wherein the first local oscillation wave differs in phase by 180° from one of the third local oscillation wave or the fourth local oscillation wave, wherein the second local oscillation wave differs in phase by 180° from one of the third local oscillation wave or the fourth local oscillation wave, and wherein only one of the differential terminals has an inverted connection relationship with respect to the other differential terminals, to suppress spurious responses ascribable to the common-mode signals.

2. The mixer according to claim 1, wherein the RF signal terminals of the first unit mixer, the second unit mixer, the third unit mixer, and the fourth unit mixer are each formed of the differential terminal, and wherein the RF signal terminal of one unit mixer of the first unit mixer, the second unit mixer, the third unit mixer, and the fourth unit mixer is inverted and connected to the combiner.

3. The mixer according to claim 1, wherein the baseband signal terminals of the first unit mixer, the second unit mixer, the third unit mixer, and the fourth unit mixer are each formed of the differential terminal, and wherein the baseband signal terminal of one unit mixer of the first unit mixer, the second unit mixer, the third unit mixer, and the fourth unit mixer is inverted and connected to the first input terminal or the second input terminal.

4. The mixer according to claim 1, wherein the first local oscillation wave is formed of a local oscillation wave having a phase of 0°, wherein the second local oscillation wave is formed of a local oscillation wave having a phase of 90°, wherein the third local oscillation wave is formed of a local oscillation wave having a phase of 270°, and wherein the fourth local oscillation wave is formed of a local oscillation wave having a phase of 180°.

5. The mixer according to claim 2, wherein the first local oscillation wave is formed of a local oscillation wave having a phase of 0°, wherein the second local oscillation wave is formed of a local oscillation wave having a phase of 90°, wherein the third local oscillation wave is formed of a local oscillation wave having a phase of 270°, and wherein the fourth local oscillation wave is formed of a local oscillation wave having a phase of 180°.

6. The mixer according to claim 3, wherein the first local oscillation wave is formed of a local oscillation wave having a phase of 0°, wherein the second local oscillation wave is formed of a local oscillation wave having a phase of 90°, wherein the third local oscillation wave is formed of a local oscillation wave having a phase of 270°, and wherein the fourth local oscillation wave is formed of a local oscillation wave having a phase of 180°.

7. The mixer according to claim 1, wherein the combiner includes a first combiner, a second combiner, and a third combiner, wherein the second combiner is configured to combine output of the first unit mixer and output of the second unit mixer, wherein the third combiner is configured to combine output of the third unit mixer and output of the fourth unit mixer, and wherein the first combiner is configured to combine output of the second combiner and output of the third combiner.

8. The mixer according to claim 1, wherein the first local oscillation wave and the second local oscillation wave are oscillated from a first LO wave oscillator, wherein the third local oscillation wave and the fourth local oscillation wave are oscillated from a second wave oscillator, and wherein the first LO wave oscillator and the second LO wave oscillator are each formed of a quadrature oscillator.

9. The mixer according to claim 1, further comprising a 90° phase difference splitter configured to receive input of a third input signal and generate, from the third input signal, the first input signal to be input to the first input terminal and the second input signal to be input to the second input terminal, wherein the mixer is configured to operate as an image rejection mixer.

10. The mixer according to claim 3, further comprising:

a fifth unit mixer including: a fifth RF signal terminal configured to receive input of a signal from the combiner; a fifth LO input terminal configured to receive input of a fifth local oscillation wave having the same phase as the phase of the first local oscillation wave; and a fifth baseband signal terminal configured to output a signal obtained by multiplying a signal input to the fifth RF signal terminal and the fifth local oscillation wave input to the fifth LO input terminal;

a sixth unit mixer including: a sixth RF signal terminal configured to receive input of a signal from the combiner; a sixth LO input terminal configured to receive input of a sixth local oscillation wave having the same phase as the phase of the second local oscillation wave; and a sixth baseband signal terminal configured to output a signal obtained by multiplying a signal input to the sixth RF signal terminal and the sixth local oscillation wave input to the sixth LO input terminal;

a first bias control circuit configured to output a first bias voltage corresponding to a magnitude of a signal output from the fifth baseband signal terminal; and a second bias control circuit configured to output a second bias voltage corresponding to a magnitude of a signal output from the sixth baseband signal terminal, wherein the first unit mixer includes a first LO leak control terminal configured to receive input of a signal for controlling an amplitude and a polarity of an LO leak, wherein the second unit mixer includes a second LO leak control terminal configured to receive input of a signal for controlling an amplitude and a polarity of an LO leak, and wherein the first LO leak control terminal is connected to an output terminal of the first bias control circuit; and the second LO leak control terminal is connected to an output terminal of the second bias control circuit.

11. The mixer according to claim 3, further comprising:

a fifth unit mixer including: a fifth RF signal terminal configured to receive input of a signal from the combiner; a fifth LO input terminal configured to receive input of a fifth local oscillation wave having the same phase as the phase of the fourth local oscillation wave;

and a fifth baseband signal terminal configured to output a signal obtained by multiplying a signal input to the fifth RF signal terminal and the fifth local oscillation wave input to the fifth LO input terminal;

a sixth unit mixer including: a sixth RF signal terminal configured to receive input of a signal from the combiner; a sixth LO input terminal configured to receive input of a sixth local oscillation wave having the same phase as the phase of the third local oscillation wave; and a sixth baseband signal terminal configured to output a signal obtained by multiplying a signal input to the sixth RF signal terminal and the sixth local oscillation wave input to the sixth LO input terminal;

a first bias control circuit configured to output a first bias voltage corresponding to a magnitude of a signal output from the fifth baseband signal terminal; and a second bias control circuit configured to output a second bias voltage corresponding to a magnitude of a signal output from the sixth baseband signal terminal, wherein the fourth unit mixer includes a first LO leak control terminal configured to receive input of a signal for controlling an amplitude and a polarity of an LO leak, wherein the third unit mixer includes a second LO leak control terminal configured to receive input of a signal for controlling an amplitude and a polarity of an LO leak, and wherein the first LO leak control terminal is connected to an output terminal of the first bias control circuit, and the second LO leak control terminal is connected to an output terminal of the second bias control circuit.

12. The mixer according to claim 10, wherein the mixer is configured to determine the first bias voltage as a first reference voltage and determine the second bias voltage as a second reference voltage when the first input signal is not input to the first input terminal and the second input signal is not input to the second input terminal, and wherein the mixer is configured to set an output voltage from the first bias control circuit as the first reference voltage and set an output voltage from the second bias control circuit as the second reference voltage when the first input signal is input to the first input terminal and the second input signal is input to the second input terminal.

13. The mixer according to claim 11, wherein the mixer is configured to determine the first bias voltage as a first reference voltage and determine the second bias voltage as a second reference voltage when the first input signal is not input to the first input terminal and the second input signal is not input to the second input terminal, and wherein the mixer is configured to set an output voltage from the first bias control circuit as the first reference voltage and set an output voltage from the second bias control circuit as the second reference voltage when the first input signal is input to the first input terminal and the second input signal is input to the second input terminal.

14. The mixer according to claim 10, wherein the first local oscillation wave is a local oscillation wave having a phase of 0°, wherein the second local oscillation wave is a local oscillation wave having a phase of 90°, wherein the third local oscillation wave is a local oscillation wave having a phase of 270°, and wherein the fourth local oscillation wave is a local oscillation wave having a phase of 180°.

15. The mixer according to claim 10, wherein the first local oscillation wave and the second local oscillation wave are oscillated from a first LO wave oscillator, wherein the third local oscillation wave and the fourth local oscillation wave are oscillated from a second LO wave oscillator, wherein the fifth local oscillation wave and the sixth local oscillation wave are oscillated from a third LO wave oscillator, and wherein the first LO wave oscillator, the second LO wave oscillator, and the third LO wave oscillator are each formed of a quadrature oscillator.

16. The mixer according to claim 10, further comprising a 90° phase difference splitter configured to receive input of a third input signal and generate, from the third input signal, the first input signal to be input to the first input terminal and the second input signal to be input to the second input terminal, wherein the mixer is configured to operate as an image rejection mixer.

17. The mixer according to claim 10, further comprising a directional device which is provided between the fifth unit mixer and sixth unit mixer and the combiner, and is configured to pass therethrough a signal from an output terminal of the combiner toward the fifth RF signal terminal and a signal from the output terminal of the combiner toward the sixth RF signal terminal, and to cut off a signal from the fifth RF signal terminal toward the output terminal of the combiner and a signal from the sixth RF signal terminal toward the output terminal of the combiner.

18. The mixer according to claim 10, wherein a frequency of the fifth local oscillation wave is set to have a value different from a frequency of the first local oscillation wave, and a frequency of the sixth local oscillation wave is set to have a value different from a frequency of the second local oscillation wave.

19. The mixer according to claim 10, wherein a frequency of the fifth local oscillation wave is set to have a value different from a frequency of the fourth local oscillation wave, and a frequency of the sixth local oscillation wave is set to have a value different from a frequency of the third local oscillation wave.

* * * * *